US006825504B2

(12) United States Patent
Ishizuka et al.

(10) Patent No.: US 6,825,504 B2
(45) Date of Patent: Nov. 30, 2004

(54) SEMICONDUCTOR INTEGRATED CIRCUIT DEVICE AND METHOD OF MANUFACTURING THE SAME

(75) Inventors: Hiroyasu Ishizuka, Ome (JP); Kousuke Okuyama, Kawagoe (JP); Katsuhiko Kubota, Higashiyamato (JP)

(73) Assignees: Hitachi, Ltd., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 0 days.

(21) Appl. No.: 10/277,152

(22) Filed: Oct. 22, 2002

(65) Prior Publication Data

US 2003/0047751 A1 Mar. 13, 2003

Related U.S. Application Data

(63) Continuation of application No. 09/297,513, filed on May 3, 1999, now Pat. No. 6,469,325.

(51) Int. Cl.[7] .............................................. H01L 29/72
(52) U.S. Cl. ....................... 257/173; 257/107; 257/110; 257/111; 257/121; 257/355; 257/367
(58) Field of Search ................................ 257/173, 107, 257/110–111, 121, 355, 367

(56) References Cited

U.S. PATENT DOCUMENTS 3,806,773 A * 4/1974 Watanabe .................... 257/356
4,476,476 A * 10/1984 Yu et al. ...................... 257/359

(List continued on next page.)

FOREIGN PATENT DOCUMENTS

| EP | 352896 | * | 8/1995 |
|---|---|---|---|
| JP | 51-132976 | * | 11/1976 |
| JP | 58-30143 | * | 2/1983 |
| JP | 61-6553 | | 2/1986 |
| JP | 1-158766 | | 6/1989 |
| JP | 2-97066 | | 4/1990 |
| JP | 2119169 | | 5/1990 |
| JP | 04196352 | | 7/1992 |
| JP | 4196352 | | 7/1992 |
| JP | 4-211156 | | 8/1992 |
| JP | 6-53407 | | 2/1994 |
| JP | 662529 | | 3/1994 |
| JP | 677405 | | 3/1994 |
| JP | 8222643 | | 8/1996 |

OTHER PUBLICATIONS

Wu et al., "A New On–Chip EDS Protection Circuit With Dual Parasitic SCR Structures for CMOS VLSI" IEEE 1991 Custom Integrated Circuits Conference.

Rountree et al., "A Process–Tolerant Input Protection Circuit for Advanced CMOS Processes" 1988 EOS/ESD Symposium Proceedings.

*Primary Examiner*—Nathan J. Flynn
*Assistant Examiner*—Ahmed N. Sefer
(74) *Attorney, Agent, or Firm*—Antonelli, Terry, Stout & Kraus, LLP

(57) ABSTRACT

In order to eliminate the difference in ESD resistance caused by polarities of excessive voltages applied to an external terminal and enhance ESD resistance of a semiconductor integrated circuit device to both the positive and negative overvoltages, a protection element having a thyristor structure, for protecting an internal circuit from the positive overvoltage and a protection element made up of a diode D1 for protecting the internal circuit from the negative overvoltage are provided between the external terminal and a ground potential.

14 Claims, 16 Drawing Sheets

U.S. PATENT DOCUMENTS

| | | | | |
|---|---|---|---|---|
| 4,686,602 A | * | 8/1987 | Bucksch | 361/56 |
| 4,763,184 A | | 8/1988 | Krieger et al. | 357/43 |
| 4,870,530 A | | 9/1989 | Hurst et al. | |
| 4,937,471 A | * | 6/1990 | Park et al. | 307/296.5 |
| 5,010,380 A | * | 4/1991 | Avery | 357/23.13 |
| 5,060,037 A | * | 10/1991 | Rountree | 357/23.13 |
| 5,343,053 A | | 8/1994 | Avery | |
| 5,349,212 A | * | 9/1994 | Seki | 257/133 |
| 5,465,189 A | * | 11/1995 | Polgreen et al. | 361/58 |
| 5,548,134 A | * | 8/1996 | Tailliet | 257/173 |
| 5,610,426 A | * | 3/1997 | Asai et al. | 257/360 |
| 5,780,905 A | * | 7/1998 | Chen et al. | 257/355 |
| 5,814,865 A | * | 9/1998 | Duvvury et al. | 257/360 |
| 5,895,940 A | * | 4/1999 | Kim | 257/173 |
| 6,013,941 A | | 1/2000 | Shimizu | 257/565 |
| 6,064,093 A | | 5/2000 | Ohta | 257/355 |

* cited by examiner

SEMICONDUCTOR INTEGRATED CIRCUIT DEVICE AND METHOD OF MANUFACTURING THE SAME

CROSS-REFERENCE TO RELATED APPLICATIONS

This application is a Continuation application of application Ser. No. 09/297,513, filed May 3, 1999, which is issued Oct. 22, 2002, now U.S. Pat. No. 6,469,325, the entire disclosure of which is hereby incorporated by reference.

BACKGROUND OF THE INVENTION

This invention relates to a semiconductor integrated circuit device and a manufacturing technique therefore; and more particularly, the invention relates to a technique effective for use in a semiconductor integrated circuit device, provided with a protection circuit having a thyristor structure, and a manufacturing technique therefore.

With advances in miniature processing technology in a semiconductor manufacturing process, miniaturization of elements, interconnections, etc. constituting a semiconductor integrated circuit device, is now receiving considerable attention. With such miniaturization, the performance of the semiconductor integrated circuit device is increasingly improving.

On the one hand, however, a problem arises in that the miniaturized elements, interconnections, etc. are extremely susceptible to an excessive voltage or overvoltage, such as static electricity or the like, and are easily broken. There has been a strong demand for elucidation of the mechanism which causes the deterioration and the destructive phenomena due to static electricity and the establishment of a protective structure with a view toward ensuring the reliability of the semiconductor integrated circuit device.

Meanwhile, the present inventors have discussed a protection circuit having a thyristor structure. This protection circuit is electrically connected to a wiring path for connecting an external terminal and an internal circuit to one another. Described more specifically, the protection circuit is constructed by electrically connecting, for example, a thyristor having $p^+$, n, p and $n^+$ between an external terminal and a ground potential.

In the present protection circuit, a discharge path varies according to the polarity of the voltage applied from the outside. The protection circuit has a structure wherein, when an excessive voltage or overvoltage applied from the outside is positive, the protection circuit is discharged in accordance with the operation of the thyristor; and, when the overvoltage is negative, it is discharged in accordance with the operation of each lateral bipolar transistor.

A known protection circuit has been described in, for example, the IEEE, 1991, CUSTOM INTEGRATED CIRCUIT CONFERENCE 27.2.1. According to this reference, since parasitic bipolar transistors, each having a large drive capability, are used as protection elements, a surge current is allowed to escape satisfactorily so that the electro static discharge (hereinafter called "ESD") resistance can be enhanced.

Further, a protection circuit having a thyristor structure has been described in, for example, the 1988 EOS/ESD SYMPOSIUM PROCEEDINGS [A PROCESS-TOLERANT INPUT PROTECTION CIRCUIT FOR ADVANCED CMOS PROCESSES], P201–P205. The basic device structure and operation of a thyristor constituting the protection circuit have been explained in this publication.

Another known protection circuit having a thyristor structure has been disclosed in, for example, Japanese Patent Application Laid-Open No. 4-196352 (reference 1) or Japanese Patent Application Laid-Open No. 6-62529 (reference 2). According to these references 1 and 2, a diode (corresponding to reference numeral 300 in FIG. 3 or the like in the reference 1 or symbol D1 in FIG. 1 or the like in the reference 2) for the protection circuit is provided in a stage posterior to a thyristor for the protection circuit. In these references, however, the diode is provided in a stage posterior to a resistor for the protection circuit, which has been intentionally added to the stage posterior to the thyristor, and is provided in a region different from a well in which the thyristor is provided in a semiconductor substrate.

SUMMARY OF THE INVENTION

However, the present inventors have discovered a problem in the protection circuit having a thyristor structure in that a difference in the ESD resistance tends to occur according to the polarity of an overvoltage applied from the outside.

That is, the protection circuit having a thyristor structure has a problem in that, when the holding voltage is low and the amount of energy used up or consumed through the discharge path is dispersed in a low state when the discharge is carried out through the thyristor (when a positive overvoltage is applied), the ESD resistance is high; whereas when the holding voltage is high, the amount of energy consumed through the discharge path is large and the discharge current is easily concentrated on a reverse junction when the discharge is carried out through each lateral bipolar transistor (when a negative overvoltage is applied), the ESD resistance is low.

Therefore, an object of the present invention is to provide a technique which is capable of eliminating the difference in ESD resistance caused by different polarities of overvoltages applied to an external terminal, and which is capable of enhancing the ESD resistance of a semiconductor integrated circuit device to both positive and negative overvoltages.

The above and other objects and novel features of the present invention will become apparent from the description provided in the present specification and the accompanying drawings.

A summary of typical features of the invention as disclosed in the present application will be described in brief in the following manner.

According to one aspect of the present invention, there is provided a semiconductor integrated circuit device comprising:

a protection element having a thyristor structure, which is electrically connected between an external terminal and a ground potential, the protection element being provided on a semiconductor substrate, and a diode serving as a protection element electrically connected between the external terminal and the ground potential so that the diode is connected in the forward direction when a negative overvoltage is applied to the external terminal.

Thus, since a diode for allowing a negative overvoltage to escape is provided as a protection element as well as a thyristor for allowing a positive overvoltage to escape, an excessive current or overcurrent is allowed to promptly escape from a ground potential to an external terminal through the diode when the negative overvoltage is applied to the external terminal. It is therefore possible to enhance the ESD resistance to a negative overvoltage. That is, according to the present invention, since a high ESD resistance to both positive and negative overvoltages applied to the external terminal can be obtained, the yield and reliability of the semiconductor integrated circuit device can be enhanced.

Further, since a protection circuit element is made up of a diode of relatively small area, the entire occupied area of a protection circuit will not significantly increase. Therefore, a high ESD resistance to both positive and negative overvoltages applied to the external terminal can be obtained.

According to another aspect of the present invention, there is provided a semiconductor integrated circuit device, wherein a protection element having the thyristor structure includes;

a first semiconductor region of a conductivity type opposite to that of the semiconductor substrate, which is formed in an upper layer of the semiconductor substrate;

a second semiconductor region of a conductivity type opposite to that of the semiconductor substrate, the second semiconductor region being formed in an upper layer of the semiconductor substrate so as to be spaced away from the first semiconductor region;

a third semiconductor region corresponding to a region of a conductivity type opposite to that of the first semiconductor region, the third semiconductor region being formed between at least the first semiconductor region and the second semiconductor region in the semiconductor substrate;

a fourth semiconductor region formed within the first semiconductor region, constructed by a semiconductor region of the same conductivity type as that of the first semiconductor region and electrically connected to the external terminal;

a fifth semiconductor region formed within the first semiconductor region so as to be adjacent to the fourth semiconductor region, constructed by a semiconductor region of a conductivity type opposite to that of the first semiconductor region and which is electrically connected to the external terminal;

a sixth semiconductor region of the same conductivity type as that of the first semiconductor region, the sixth semiconductor region having one portion disposed in the first semiconductor region and the other portion disposed in a region between the first semiconductor region and the second semiconductor region; and a seventh semiconductor region having one portion disposed in the second semiconductor region and the other portion disposed in a region between the first semiconductor region and the second semiconductor region so as to be spaced away from the sixth semiconductor region, the seventh semiconductor region being constructed by a semiconductor region of the same conductivity type as that of the first semiconductor region and being electrically connected to the ground potential; and a diode having an eighth semiconductor region of a conductivity type opposite to that of the first semiconductor region, the eighth semiconductor region being electrically connected to the ground potential and provided within the first semiconductor region.

Thus, since the resistance of a discharge path for an overcurrent can be reduced, the overcurrent is allowed to escape promptly.

According to a further aspect of the present invention, there is provided a semiconductor integrated circuit device wherein the fourth semiconductor region and the eighth semiconductor region are disposed so that respective long sides thereof are opposed to each other in parallel. Thus, the width of a discharge path for an overcurrent can be broadened and the discharge path can be reduced in resistance. Therefore, the overcurrent is allowed to escape rapidly owing to the reduction in the discharge path resistance.

According to a still further aspect of the present invention, there is provided a method of manufacturing a semiconductor integrated circuit device, comprising the step of simultaneously carrying out impurity introducing steps for forming the fifth semiconductor region constituting the protection element having a thyristor structure and the eighth semiconductor region constituting the protection element formed by the diode with the same photoresist patterns as masks in a manufacturing process of the semiconductor integrated circuit device.

Thus, since the manufacturing process of the semiconductor integrated circuit device can be simplified, a reduction in manufacturing time of the semiconductor integrated circuit device and a decrease in manufacturing cost thereof can be promoted.

According to a still further aspect of the present invention there is provided a semiconductor integrated circuit device comprising:

a signal external terminal for externally inputting a signal;

a reference potential external terminal externally supplied with a reference potential;

a protection element having a thyristor structure;

a protection element having a diode structure;

the signal external terminal, the reference potential external terminal, the protection element having the thyristor structure and the protection element having the diode structure being provided on a semiconductor substrate; and a protection circuit structure wherein the protection element having the thyristor structure and the protection element having the diode structure are connected in parallel between the signal external terminal and the reference potential external terminal, the protection element having thyristor structure including;

a first semiconductor region of a first conductivity type, which is formed in the semiconductor substrate;

a second semiconductor region of said first conductivity type, which is formed in the semiconductor substrate at a position spaced away from the first semiconductor region;

a third semiconductor region of a second conductivity type, the third semiconductor region corresponding to a region of a conductivity type opposite to that of the first conductivity type and being formed between at least the first conductivity type first semiconductor region and the first conductivity type second semiconductor region in the semiconductor substrate;

a fourth semiconductor region of said first conductivity type, which is formed within the first conductivity type first semiconductor region and is electrically connected to the signal external terminal;

a fifth semiconductor region of said second conductivity type, which is formed within the first conductivity type first semiconductor region and is electrically connected to the signal external terminal;

a sixth semiconductor region of said first conductivity type, the sixth semiconductor region being formed in the semiconductor substrate so that a portion thereof is disposed in the first conductivity type first semiconductor region and the second conductivity type third semiconductor region; and a seventh semiconductor region of said first conductivity type, which is formed in the semiconductor substrate so that a portion thereof is disposed in the first conductivity type second semiconductor region and the second conductivity type third semiconductor region, the seventh semiconductor region being electrically connected to the reference potential external terminal; and the protection element having a diode structure including:

an eighth semiconductor region of said second conductivity type, which is formed within the first conductivity type first semiconductor region and is electrically connected to the reference potential external terminal.

According to a still further aspect of the present invention, there is provided a semiconductor integrated circuit device comprising:

a semiconductor substrate;

an MIS transistor formed in the semiconductor substrate and having a gate, a source and a drain;

a signal external terminal formed in the semiconductor substrate and which is electrically connected to the gate of the MIS transistor to input an externally-supplied signal to the gate of the MIS transistor;

a reference potential external terminal formed in the semiconductor substrate and which is electrically connected to the source of the MIS transistor to supply an externally-input reference potential to the source of the MIS transistor;

a protection element having a thyristor structure, which is formed in the semiconductor substrate and is electrically connected between the signal external terminal and the reference potential external terminal;

a protection element having a diode structure, which is formed in the semiconductor substrate and is electrically connected between the signal external terminal and the reference potential external terminal; and a protection element provided at the semiconductor substrate, the protection element being provided between both the protection element having the thyristor, structure and the protection element having the diode structure and the gate of the MIS transistor, being electrically connected between the signal external terminal and the reference potential external terminal, and serving so as to reduce the difference in potential between the source and gate of the MIS transistor when a voltage greater than that used upon normal operation thereof is applied to the MIS transistor.

According to a still further aspect of the present invention, there is provided a semiconductor integrated circuit device comprising:

a signal external terminal for externally inputting a signal;

a reference potential external terminal externally supplied with a reference potential;

an MIS transistor having a source, a drain and a gate, the gate being electrically connected to the signal external terminal and the source being electrically connected to the reference potential external terminal;

a protection element having a thyristor structure; and a protection element having a diode structure;

the signal external terminal, the reference potential external terminal, the MIS transistor, the protection element having the thyristor structure and the protection element having the diode structure being provided on a semiconductor substrate; and wherein the protection element having the thyristor structure and the protection element having the diode structure are connected in parallel between the signal external terminal and the reference potential external terminal;

the protection element haying the thyristor structure including:

a first semiconductor region of a first conductivity type, which is formed in the semiconductor substrate;

a second semiconductor region of said first conductivity type, which is formed in the semiconductor substrate at a position spaced away from the first semiconductor region;

a third semiconductor region of a second conductivity type, the third semiconductor region corresponding to a region of a conductivity type opposite to the first conductivity type and being formed between at least the first conductivity type first semiconductor region and the first conductivity type second semiconductor region the semiconductor substrate;

a fourth semiconductor region of said first conductivity type formed within the first conductive type first semiconductor region and electrically connected to the signal external terminal;

a fifth semiconductor region of said second conductivity type formed within the first conductive type first semiconductor region and electrically connected to the signal external terminal;

a sixth semiconductor region of said first conductivity type, the sixth semiconductor region being formed in the semiconductor substrate so that a portion thereof is disposed in the first conductivity type first semiconductor region and the second conductivity type third semiconductor region; and a seventh semiconductor region of said first conductivity type, which is formed in the semiconductor substrate so that a portion thereof is disposed in the first conductivity type second semiconductor region and the second conductivity type third semiconductor region, the seventh semiconductor region being electrically connected to the reference potential external terminal; and the protection element having the diode structure including;

an eighth semiconductor region of said second conductivity type, which is formed within the first conductivity type first semiconductor region and is electrically connected to the reference potential external terminal.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Figure 1:
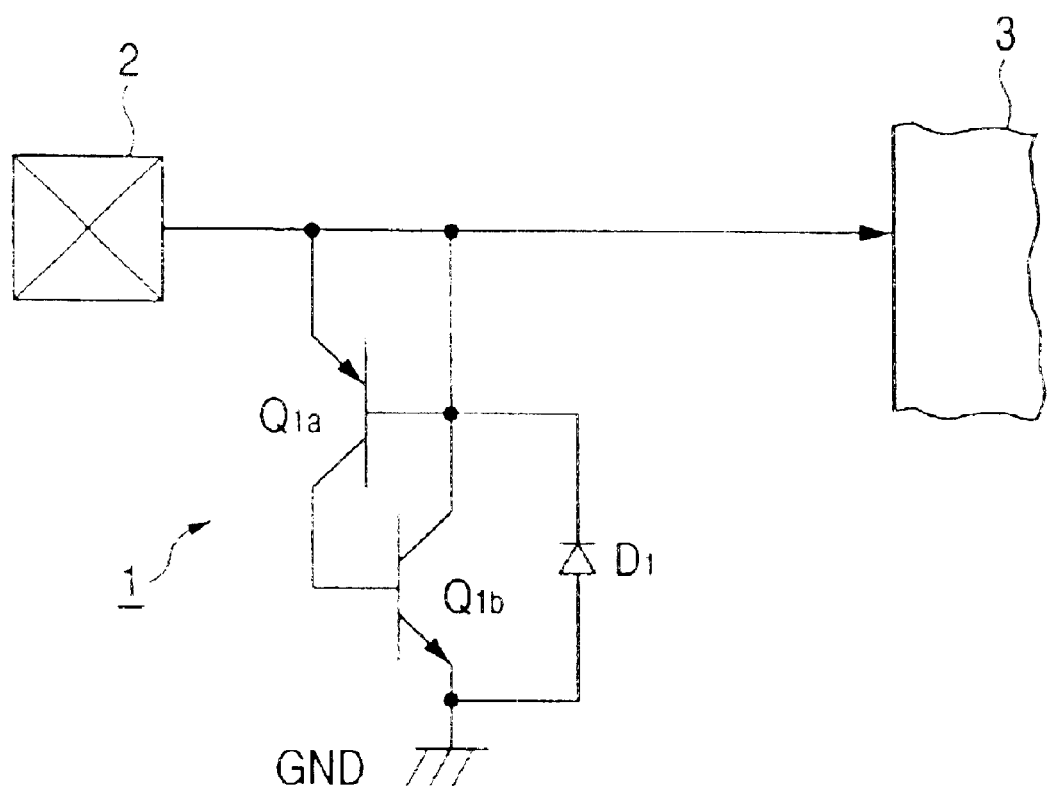
FIG. 1 is a circuit diagram showing a protection circuit employed in a semiconductor integrated circuit device according to one embodiment of the present invention.

The present invention will be described in more detail with reference to the accompanying drawings. In all the drawings for various embodiments, those elements having the same function are identified by like reference numerals and their repetitive description will be omitted.

[Embodiment 1]

Figure 2:
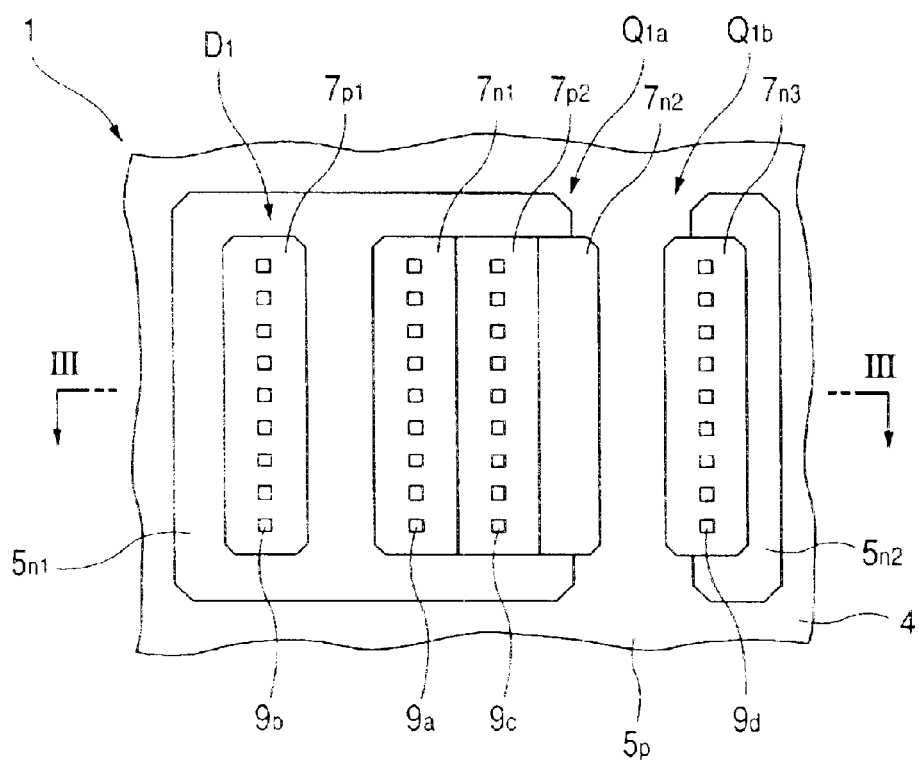
FIG. 2 is a fragmentary plan view illustrating a protection circuit region of the semiconductor integrated circuit device shown in FIG. 1.
Figure 3:
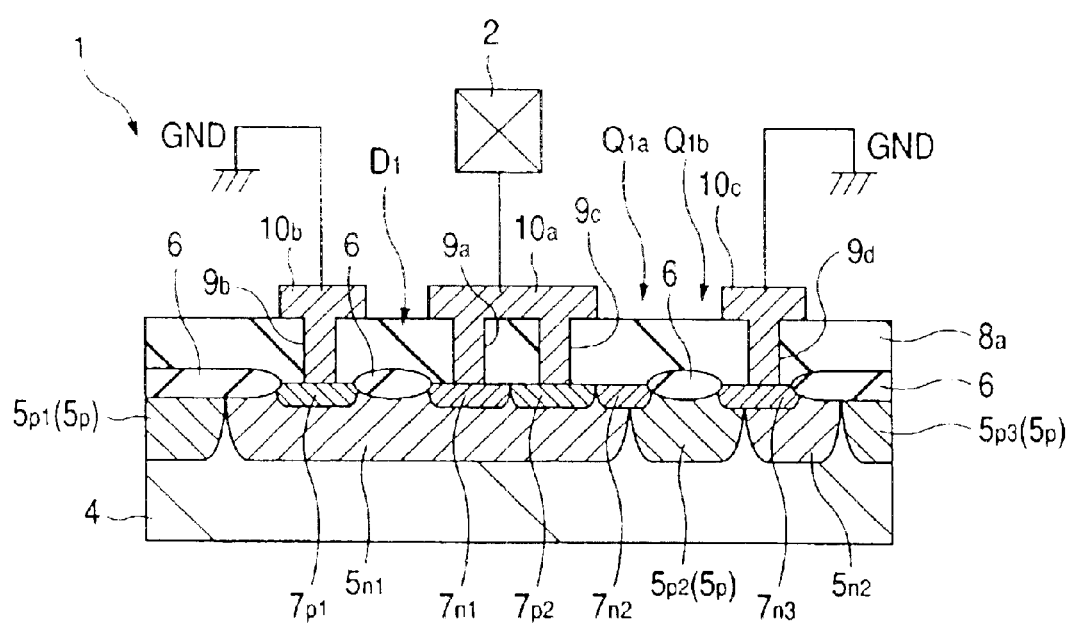
FIG. 3 is a cross-sectional view taken along line III—III of FIG. 2.
Figure 4:
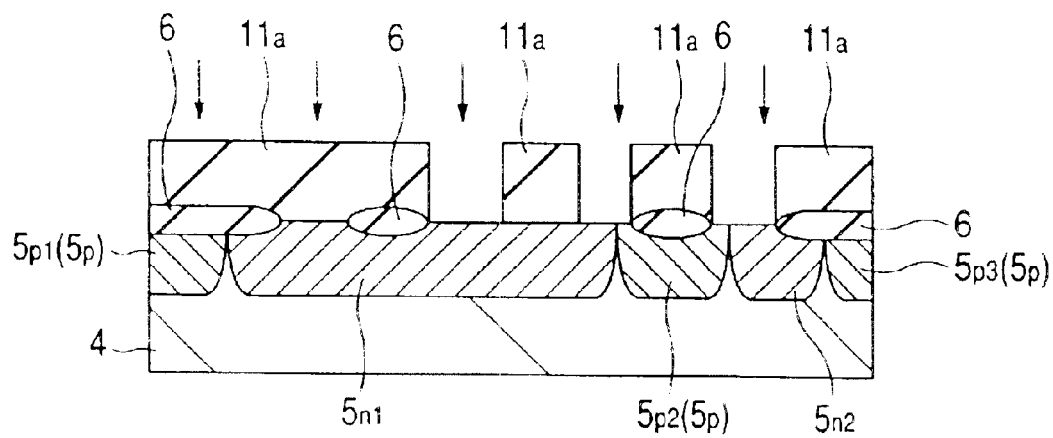
FIG. 4 is a fragmentary cross-sectional view of the semiconductor integrated-circuit device shown in FIG. 1 through FIG. 3 in a manufacturing process thereof.
Figure 5:
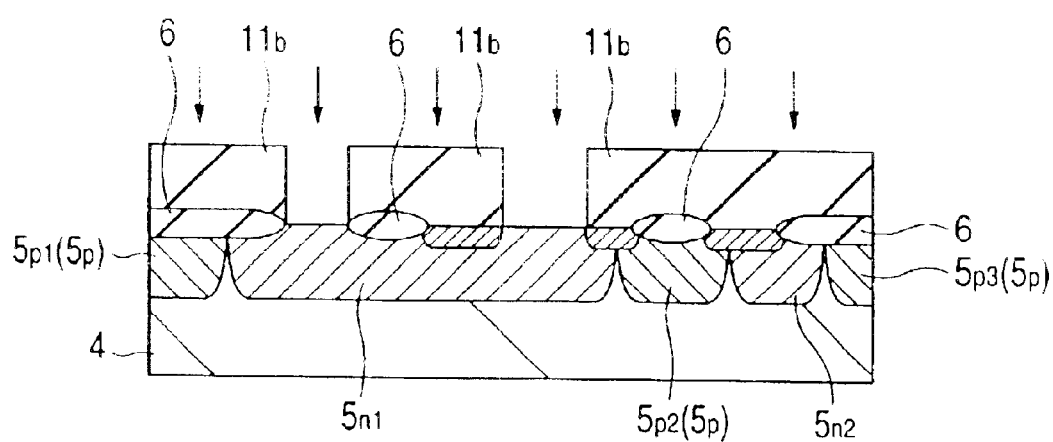
FIG. 5 is a fragmentary cross-sectional view of the semiconductor integrated circuit device shown in FIG. 1 through FIG. 3 in a manufacturing process thereof subsequent to that in FIG. 4.
Figure 6:
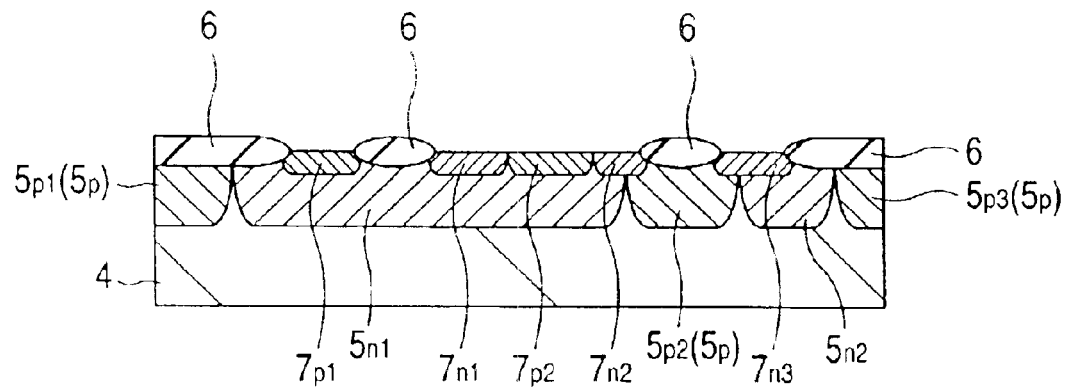
FIG. 6 is a fragmentary cross-sectional view of the semiconductor integrated circuit device shown in FIG. 1 through FIG. 3 in a manufacturing process there of subsequent to that in FIG. 5.

FIG. 1 is a circuit diagram showing a protection circuit employed in a semiconductor integrated circuit device according to one embodiment of the present invention. FIG. 2 is a fragmentary plan view illustrating a protection circuit region of the semiconductor integrated circuit device shown in FIG. 1. FIG. 3 is a cross-sectional view taken along line III—III of FIG. 2. FIG. 4 through FIG. 6 are fragmentary cross-sectional views showing the semiconductor integrated circuit device shown in FIGS. 1 through 3 in respective manufacturing processes.

A protection circuit employed in a semiconductor Integrated circuit device, which has been discussed by the present inventors, will first be described with reference to FIG. 29 through FIG. 31 prior to the description of the semiconductor integrated circuit device according to the present embodiment 1.

Figure 29:
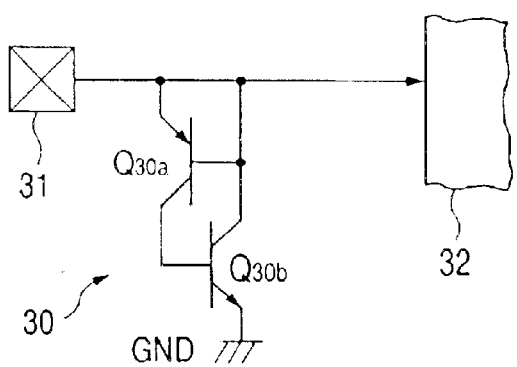
FIG. 29 is a circuit diagram showing a protection circuit discussed by the present inventors as a reference technique.

FIG. 29 is a circuit diagram showing the protection circuit discussed by the present inventors. The protection circuit 30 is, electrically connected to a wiring path for connecting an external terminal 31 and an internal circuit 32 to each other.

The protection circuit 30 comprises a thyristor composed of two bipolar transistors Q30$a$ and Q30$b$ and is electrically connected between the external terminal 31 and ground potential GND.

The bipolar transistor Q30$a$ comprises a pnp bipolar transistor. The emitter of the bipolar transistor Q30$a$ is electrically connected to the external terminal 31 and the collector thereof is electrically connected to the base of the npn bipolar transistor Q30$b$.

Further, the base of the bipolar transistor Q30$a$ is electrically connected to the external terminal 31 to the collector of the bipolar transistor Q30$b$. The emitter of the bipolar transistor Q30$b$ is electrically connected to ground potential GND.

Figure 30:
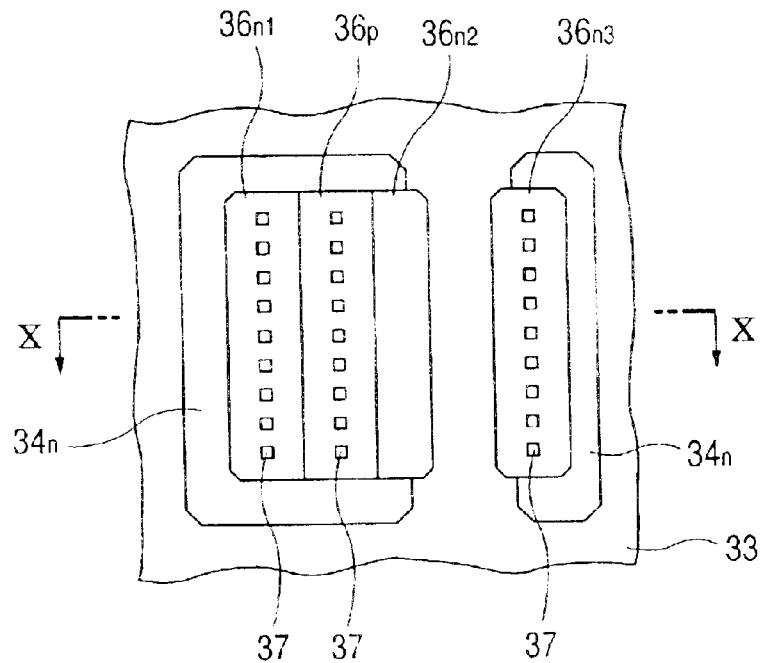
FIG. 30 is a plan view illustrating the protection circuit shown in FIG. 29.
Figure 31:
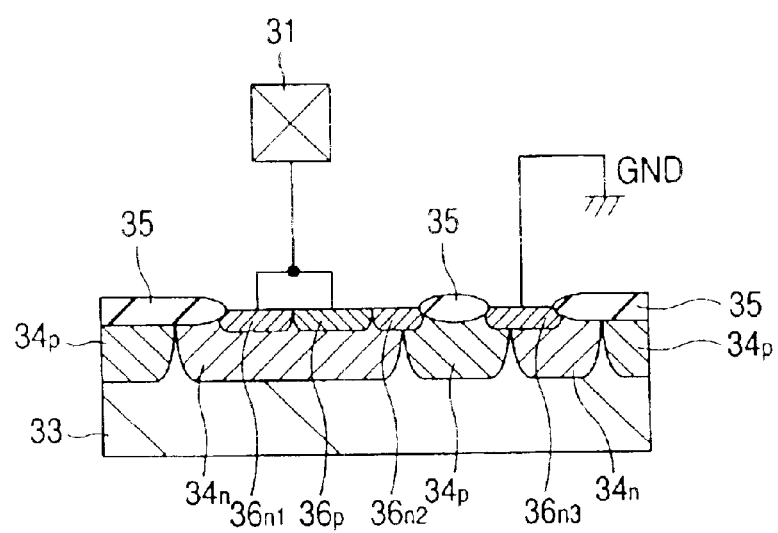
FIG. 31 is a cross-sectional view taken along line X—X of the protection circuit shown in FIG. 30.

FIGS. 30 and 31 show one example of a device structure of the protection circuit employed in the semiconductor integrated circuit device. FIG. 30 is a plan view of the device structure, and FIG. 31 is a cross-sectional view taken along line X—X of FIG. 30.

A semiconductor substrate 33 is composed of, for example, a p-type silicon (Si) monocrystal. Further, n wells 34n are provided at its upper layer portion and p wells 34p are formed in a region other than the upper layer portion. Field insulators or field insulating films 35, each composed of, for example, silicon dioxide ($SiO_2$), are formed over a main or principle surface of the semiconductor substrate 33.

In the upper layer portion of the semiconductor substrate 33, an $n^+$ type semiconductor region 36n1 and a $p^+$-type semiconductor region 36p are formed in an upper layer portion of the n well 34n surrounded by the field insulating films 35. The n-type semiconductor region 36n1 and the p-type semiconductor region 36p are electrically connected to the external terminal 31 through connecting holes 37.

In the upper layer portion of the semiconductor substrate 33 as well, $n^+$-type semiconductor regions 36n2 and 36n3 are formed in a region surrounded by the field insulating films 35 and extending over the n well 34n and the p well 34p. The $n^+$-type semiconductor region 36n3 is electrically connected to the ground potential GND through other connecting holes 37.

When a positive voltage is externally applied to the external terminal 31 in the protection circuit, the thyristor is activated through a path consisting of the $p^+$-type semiconductor region 36p, the n well 34n (n-type semiconductor region 36n1), the p well 34p (p-type, semiconductor substrate 33) and the $n^+$-type semiconductor region 36n3 to bring the external terminal 31 and the ground potential GND into conduction, whereby the thyristor is discharged.

On the other hand, when a negative voltage is externally applied to the external terminal 31, the thyristor is deactivated and the lateral bipolar transistor is activated through a path consisting of the n-type semiconductor region 36n1 (n well 34n), the p well 34p (p-type semiconductor substrate 33) and the $n^+$-type semiconductor region 36n3 to bring the external terminal 31 and the ground potential GND into conduction, whereby the bipolar transistor is discharged.

However, the protection circuit having a thyristor structure has a problem in that, when the holding voltage is low (ranges from 1V to 2V) and the amount of energy used up or consumed through the discharge path is dispersed in a low state when the discharge is carried out through the thyristor (i.e., when a positive overvoltage is applied), the ESD resistance is high; whereas, when the holding voltage is high (ranges from 7V to 12V), the amount of energy consumed through the discharge path is large and a discharge current is easily concentrated on a reverse junction when the discharge is carried out through the lateral bipolar transistor (i.e., when a negative overvoltage is applied), the ESD resistance is low.

Thus, the protection circuit is configured in the following manner in the embodiment 1 of the present invention.

As shown in FIG. 1, the protection circuit 1 employed in the present embodiment 1 is configured as a circuit which is electrically connected to a path for connecting an external terminal 2 and a peripheral circuit 3 of the semiconductor integrated circuit device and serves so as to rapidly escape or discharge electrical charges when an excessive or overvoltage is applied to the external terminal 2 to thereby avoid the application of a high voltage to an internal circuit of the semiconductor integrated circuit device.

The protection circuit 1 comprises two pnp and npn bipolar transistors Q1a and Q1b and a diode D1 electrically connected between the external terminal 2 and a ground potential GND.

The bipolar transistors Q1a and Q1b constitute a thyristor which is activated to allow electrical charges to escape when a positive overvoltage is applied to the external terminal 2. The emitter of the bipolar transistor Q1a is electrically connected to the external terminal 2. Further, the base of the bipolar transistor Q1a is electrically connected to the external terminal 2 and to the collector of the bipolar transistor Q1b. Moreover, the collector of the bipolar transistor Q1a is electrically connected to the base of the bipolar transistor Q1b. The emitter of the bipolar transistor Q1b is electrically connected to the ground potential GND.

As a result of the operation of the thyristor composed of the two bipolar transistors Q1a and Q1b, when the positive overvoltage is applied to the external terminal 2 in such a protection circuit 1, an excess current or overcurrent flows from the external terminal 2 to the ground potential GND through the two bipolar transistors Q1a and Q1b. Thus, the ESD resistance to a positive overvoltage can be ensured.

On the other hand, the diode D1 is activated so as to allow electrical charges to escape when a negative overvoltage is applied to the external terminal 2. The diode D1 is electrically connected between the external terminal 2 and the ground potential GND or between the collector and emitter of the bipolar transistor Q1b, in other words, between the base of the pnp bipolar transistor Q1a and the ground potential GND in such a manner that, when a negative overvoltage is applied to the external terminal 2, the diode D1 is connected in the forward direction.

That is, in the present embodiment 1, an overcurrent flows from the ground potential GND to the external terminal 2 through the diode D1 when a negative overvoltage is applied to the external terminal 2. Thus, the present embodiment 1 is capable of improving the ESD resistance to a negative overvoltage. Further, since the additional protection element is made up of the diode D1, the layout area of the protection element will not significantly increase.

Incidentally, the external terminal 2 serves as a terminal for drawing or taking out an electrode for a semiconductor integrated circuit in a semiconductor chip and is electrically connected to the internal circuit of the semiconductor integrated circuit device through the peripheral circuit 3.

Further, the peripheral circuit 3 is provided between the outside and inside of the semiconductor integrated circuit device as in the case of, for example, an input circuit, an output circuit or an input/output bidirectional circuit or the like, and serves as an interface circuit for adjusting an electrical level or timing.

The protection circuit 1 may be built in or incorporated into, for example, only a stage prior to the input circuit or the output circuit. Alternatively, the protection circuit 1 may be incorporated into stages prior to peripheral circuits of both the input circuit and the output circuit.

One example of a device structure for the protection circuit of the semiconductor integrated circuit device shown in FIG. 1 will next be described with reference to FIG. 2 and FIG. 3. FIG. 2 is a plan view of the device structure and FIG. 3 is a cross-sectional view taken along line III—III of FIG. 2. A semiconductor substrate 4 comprises, for example, a p-type silicon (Si) monocrystal. Further, n wells (first semiconductor region and second semiconductor region) 5n1 and 5n2 and p wells 5p (5p1 through 5p3) are formed in its upper layer portion.

The n wells 5n1 and 5n2 are formed as rectangular isolated regions, each of which contains, for example, phosphorus or arsenic (As) corresponding to an n-type impurity.

The p wells (third semiconductor region) 5p (5n1 through 5p3) are formed so as to adjoin the n wells 5n1 and 5n2 and surround them. Each of the p wells 5p contains, for example, boron corresponding to a p-type impurity. Further, field insulating films 6 are formed on a principal surface, of the semiconductor substrate 4. Each of the field insulating films 6 is composed of, for example, silicon dioxide. ($SiO_2$) and has an element separating function or in element separating function.

The above-described diode D1 is formed principally of a PN junction of the n well 5n1 and a $p^+$-type semiconductor region (eighth semiconductor region) 7p1.

An $n^+$-type semiconductor region (fourth semiconductor region) 7n1 contains, for example, phosphorus or As corresponding to the n-type impurity. The $n^+$-type semiconductor region 7n1 is electrically connected to a first layer wire or interconnection 10a through connecting holes 9a defined in an interlayer insulator or insulating film 8a on the semiconductor substrate 4 as well as to an external terminal 2.

The $p^+$-type semiconductor region 7p1 contains, for example, boron corresponding to the p-type impurity and is electrically connected to a first layer interconnection 10b through connecting holes 9b defined in the interlayer insulator 8a. Further, the $p^+$-type semiconductor region 7p1 is electrically connected to a ground potential GND.

The $p^+$-type semiconductor region 7p1 is provided within the n well 5n1 provided with the $n^+$-type semiconductor region 7n1 therewithin. That is, the value of a resistance between the $p^+$-type semiconductor region, 7p1 and the $n^+$-type semiconductor region 7n1 can be lowered by, providing the $p^+$-type semiconductor region 7p1 and the $n^+$-type semiconductor region 7n1 within the same n well 5n1.

Further, the $p^+$-type semiconductor region 7p1 is disposed so that its long side becomes parallel to the long side of the $n^+$-type semiconductor region 7n1. That is, since the long sides of the $p^+$-type semiconductor region 7p1 and the $n^+$-type semiconductor region 7n1 are opposed to each other and the width of a path for a current that flows between them can be widely ensured, the value of the resistance between them can be lowered.

Thus, since the resistance of the path for discharging an excessive current or overcurrent that flows when the negative voltage is applied to the external terminal 2 can be reduced in the present embodiment 1, the overcurrent is allowed to escape without delay.

Further, the above-described bipolar transistor Q1a is made up principally of a $p^+$-type semiconductor region (fifth semiconductor region) 7p2, the n well 5n1, an $n^+$-type semiconductor region 7n2 and a p well 5p2.

The $p^+$-type semiconductor region 7p2 is formed so as to extend next to and parallel to the $n^+$-type semiconductor region 7n1 within a region of the n well 5n1 and contains, for example, boron corresponding to the p-type impurity.

The $p^+$-type semiconductor region 7p2 is electrically connected to the first layer interconnection 10a through connecting holes 9c defined in the interlayer insulator, 8a as well as to the external terminal 2.

The $n^+$-type semiconductor region 7n2 is formed so as to extend next to and parallel to the $p^+$-type semiconductor region 7p2 across the n well 5n1 and the p well 5p2. The $n^+$-type semiconductor region 7n2 contains, for example, phosphorus or As corresponding to the n-type impurity.

The above-described bipolar transistor Q1b is made up principally of the $n^+$-type semiconductor region 7n2 (n well 5n1), the p well 5p2 and an $n^+$-type semiconductor region (seventh semiconductor region) 7n3 (n well 5n2).

The $n^+$-type semiconductor region 7n3 is formed so as to extend parallel to the $n^+$-type semiconductor region 7n2 across the p well 5p2 and the n well 5n2 and contains, for example, phosphorus or As corresponding to the n-type impurity.

The $n^+$-type semiconductor region 7n3 is, electrically connected to a first layer interconnection 10c through connecting holes 9d defined in the interlayer insulator 8a. Further, the $n^+$-type semiconductor region 7 n3 is electrically connected to the ground potential GND.

Incidentally, the above-described interlayer insulator 8 a is composed of, for example, $SiO_2$. Each of the first layer interconnections 10a through 10c is made of, for example, aluminum (Al) or an Al—Si—Cu alloy.

One example of a method of manufacturing the semiconductor integrated circuit device according to the present embodiment 1 will next be explained with reference to FIGS. 4 through 6.

FIG. 4 is a fragmentary cross-sectional view showing the semiconductor integrated circuit device according to the embodiment 1 in a manufacturing process. A semiconductor substrate 4 is composed of a p-type Si monocrystal. Further, n wells 5n1 and 5n2 and p wells 5p (5p1 through 5p3) are formed in its upper layer and field insulating films 6 are also formed in the upper layer.

Photoresist patterns 11a, which make $n^+$-type semiconductor regions bare and cover other regions, are formed on a principal surface of the semiconductor substrate 4 by photolithography.

Subsequently, for example, phosphorus or As corresponding to a p-type impurity is introduced into the semiconductor substrate 4 by ion implantation or the like with each photoresist pattern 11a being used as a mask in order to form the $n^+$-type semiconductor regions.

Thereafter, the photoresist patterns 11a are removed and photoresist patterns 11b, which make $p^+$-type semiconductor region bare and cover other regions, are further formed by photolithography as shown in FIG. 5.

Next, for example, boron or boron fluoride (BF2) corresponding to a p-type impurity is introduced into the semiconductor substrate 4 by ion implantation or the like with each photoresist pattern 11b being used as a mask in order to form the $p^+$-type semiconductor regions.

Subsequently, the photoresist patterns 11b are removed and the semiconductor substrate 4 is further heat-treated to thereby form $p^+$-type semiconductor regions 7p1 and 7p2 and $n^+$-type semiconductor regions 7n1 through 7n3 on the semiconductor substrate 4 as shown in FIG. 6.

Thereafter, an interlayer insulator 8a composed of, for example, $SiO_2$ is deposited on the semiconductor substrate 4 by a CVD process or the like as shown in FIG. 3. Afterwards, connecting holes 9a through 9d are simultaneously defined in predetermined positions of the interlayer insulator 8a by photolithography and dry etching.

After that, a metal film made up of, for example, Al or an Al—Si—Cu alloy is deposited on the semiconductor substrate 4 by sputtering or the like. Thereafter, the metal film is patterned by photolithography and dry etching to thereby form first layer interconnections 10a through 10c.

The description of the subsequent processing will be omitted because the semiconductor integrated circuit device may be manufactured through a wire or interconnection forming process step and a surface protection film forming process step and the like in the normal manufacturing process of the semiconductor integrated circuit device.

Thus, the present embodiment 1 can bring about the following advantageous effects.

(1) The provision of the diode D1 as a protection element allows an overcurrent to promptly escape from the ground potential GND to the external terminal 2 through the diode D1 when a negative overvoltage is applied to the external terminal 2. It is therefore possible to improve the ESD resistance to a negative overvoltage. That is, since the present embodiment 1 can obtain a high ESD resistance to both positive and negative overvoltages applied to the external terminal 2, the yield and reliability of the semiconductor integrated circuit device can be improved.

(2) Owing to the formation of the protection element by the diode D1, the ESD resistance to both positive and negative overvoltages applied to the external terminal can be improved without incurring a significant increase in the entire area occupied by the protection circuit.

[Embodiment 2]

Figure 7:
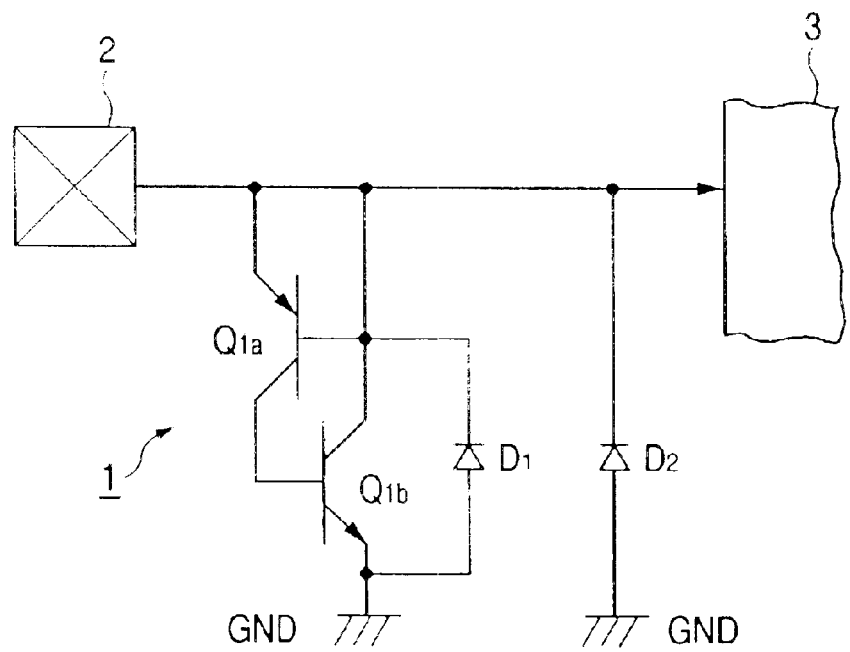
FIG. 7 is a circuit diagram showing a protection circuit employed in a semiconductor integrated circuit device according to another embodiment of the present invention.
Figure 8:
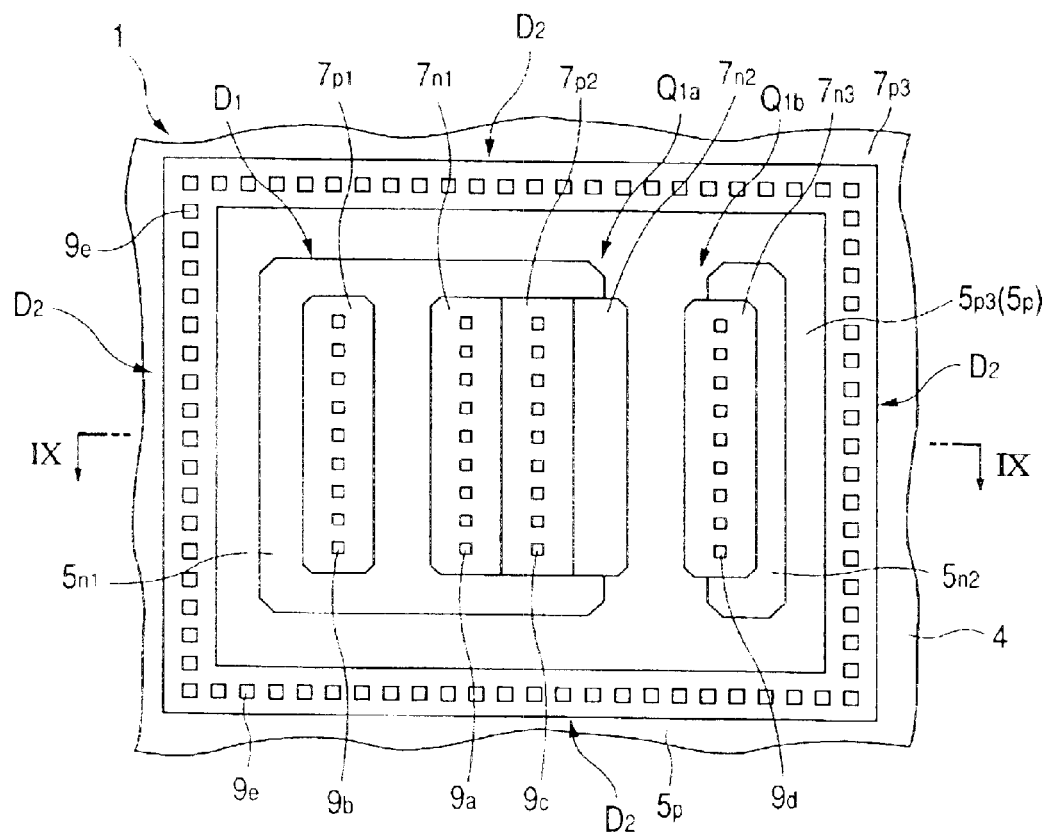
FIG. 8 is a fragmentary plan view illustrating a protection circuit region of the semiconductor integrated circuit device shown in FIG. 7.
Figure 9:
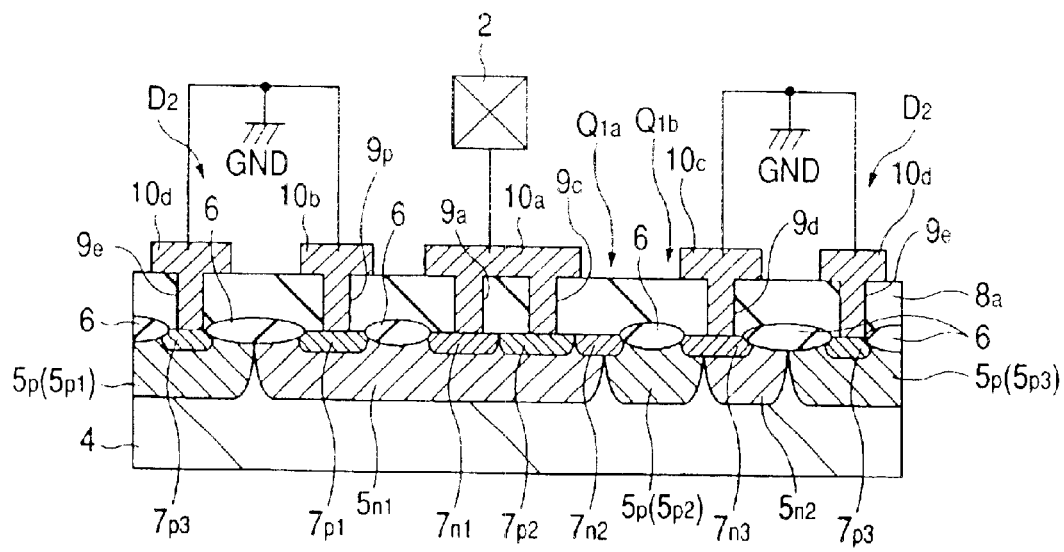
FIG. 9 is a cross-sectional view taken along line IX—IX of FIG. 8.

FIG. 7 is a circuit diagram showing a protection circuit of a semiconductor integrated circuit device according to another embodiment of the present invention. FIG. 8 is a fragmentary plan view of a protection circuit region of the semiconductor integrated circuit device shown in FIG. 7. FIG. 9 is a cross-sectional view taken along line IX—IX of FIG. 8.

In the present embodiment 2, a diode D2 is further added to the protection circuit described in the embodiment 1 as shown in FIG. 7. The diode D2 serves as a protection element activated when a negative excessive voltage or negative overvoltage is applied to an external terminal 2 to thereby allow electrical charges to escape. Further, the diode D2 is electrically connected between the external terminal 2 and ground potential GND so that the diode D2 is connected in the forward direction when a negative overvoltage is applied to the external terminal. 2.

Incidentally, the diode D2 may be provided only in a stage prior to either an input circuit or an output circuit. Alternatively, the diode D2 may be provided in stages prior to peripheral circuits of both the input circuit and the output circuit.

One example of a device structure for the protection circuit of the semiconductor integrated circuit device according to the present embodiment 2 will be described with reference to FIGS. 8 and 9. FIG. 8 is a plan view of the device structure and FIG. 9 is a cross-sectional view taken along line IX—IX of FIG. 8.

The protection circuit employed in the present embodiment 2 is identical in structure to the protection circuit employed in the embodiment 1. The protection circuit employed in the present embodiment 2 is different from that employed in the previous embodiment 1 in the following points.

That is, a $p^+$-type semiconductor region (ninth semiconductor region) 7p3 is formed in upper layers of p wells 5p so as to surround the diode D1 and bipolar transistors Q1a and Q1b. The $p^+$-type semiconductor region 7p3 contains, for example, boron corresponding to a p-type impurity. The impurity is simultaneously implanted in other $p^+$-type semiconductor regions 7p1 and 7p2 using the same mask upon ion implantation of the other $p^+$-type semiconductor regions 7p1 and 7p2.

The $p^+$-type semiconductor region 7p3 is electrically connected to a first layer interconnection 10d through connecting holes 9e defined in an interlayer insulator 8a. Further, the $p^+$-type semiconductor region 7p3 is also electrically connected to the ground potential GND. The diode D2 is composed principally of the $p^+$-type semiconductor region 7p3, the p wells 5p, a p-type semiconductor substrate 4, an n well 5n1 and an $n^+$-type semiconductor region 7nl.

That is, the present embodiment 2 has a structure in which the diode D2 is disposed so as to surround the diode D1 and the bipolar transistors Q1a and Q1b. Thus, when a negative overvoltage is applied to the external terminal 2, the present embodiment 2 is capable of promptly discharging the overcurrent developed in the forming region of the protection circuit 1 in the semiconductor substrate 4 as compared with the previous embodiment 1.

[Embodiment 3]

A semiconductor integrated circuit device according to an embodiment 3 of the present invention will next be explained with reference to FIGS. 10 through 17. Incidentally, ground sources GND and GND1 will be basically electrically connected to ground source supply external terminals in the subsequent description. Further, a ground source GND2 is a power source produced from an internal power source of the semiconductor integrated circuit device and will be electrically connected to a ground source supply external terminal through the internal power source.

Figure 10:
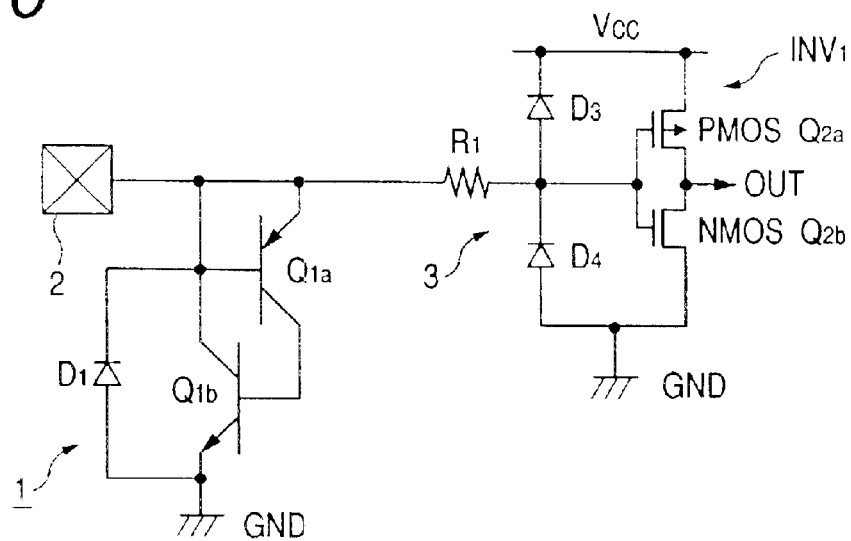
FIG. 10 is a circuit diagram illustrating a semiconductor integrated circuit device according to a further embodiment of the present invention.

A circuit structure of the semiconductor integrated circuit device according to the present embodiment 3 will first be explained with reference to FIGS. 10 through 14. Since the protection circuit 1 is identical in circuit configuration to that employed in the previous embodiment 1 as shown in FIG. 10, its detailed description will be omitted. The emitter region of the bipolar transistor Q1a constituting a thyristor and p type semiconductor region of the diode D1 are disposed within the same well.

Further, a peripheral circuit 3 provided in a stage posterior to the protection circuit 1 has a resistor R1 for the protection circuit 1, diodes D3 and D4 for the protection circuit 1, which are provided in a stage subsequent to the resistor R1, and an inverter INV1 for an input circuit, which is provided in a stage subsequent to the diodes D3 and D4. The inverter INV1 is configured such that a p channel MOS.FET Q2a and an n channel MOS.FET Q2b are series-connected between a power source VCC and a ground source GND. An output OUT of the inverter INV1 is electrically connected to an internal circuit of the semiconductor integrated circuit device. Incidentally, the ground source GND for the protection circuit 1 and the ground source GND for the resistor R1, the diodes D1 and D2 and the inverter INV1 are placed in common use.

The resistor R1 is placed between an external terminal 2 and is the input of the inverter INV1 and provided in a stage posterior to the protection circuit land is electrically connected to a stage anterior to the diodes D3 and D4. Further, the resistor R1 has the function of preventing an overcurrent from flowing into the inverter INV1 and of increasing the impedance as seen from the external terminal 2 side to thereby allow electrical charges borne on an interconnection or the like on the input side of the inverter INV1 to easily escape to the external terminal side through the diodes D3 and D4 and a power source interconnection.

Further, the diodes D3 and D4 are respectively electrically connected between an input gate electrode of the inverter INV1 and the power source VCC and between the input gate electrode thereof and the ground source GND so that they are connected in the reverse direction. When the electrical charges borne inside the semiconductor integrated circuit device are discharged by grounding the external terminal 2 during an electrostatic breakdown test or the like by a CD (Charged Device) method, the diodes D3 and D4 have the function of preventing difference from occurring between a potential on an input interconnection (including metal wiring and gate electrodes on the input side) of the inverter INV1 and a potential on a semiconductor region (diffused layer) for a well on the side of a semiconductor substrate with the MOS.FETs Q2a and Q2b of the inverter INV1 disposed thereon or for the sources drains of the MOS.FETs Q2a and Q2b. That is, the diodes D3 and D4 prevent voltages that break down the gate insulating films of the MOS.FETs Q2a and Q2b from being applied to the gate insulating films. In the semiconductor substrate, the diodes D3 and D4 are disposed within a well different front that for the diode D1 of the protection circuit 1 as will be described later.

A reference technique having no protection circuit (resistor R1 and diodes D3 and D4) at the input stage of the inverter INV1 will now be discussed with reference to FIGS. 32 and 33.

Figure 32:
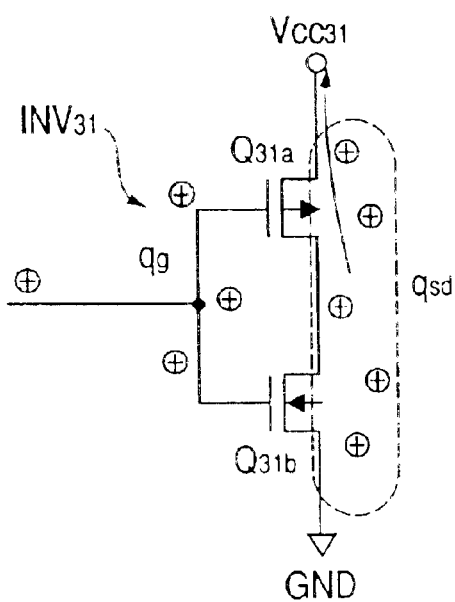
FIG. 32 is a diagram for describing the operation of a peripheral circuit discussed by the present inventors as a reference technique.
Figure 33:
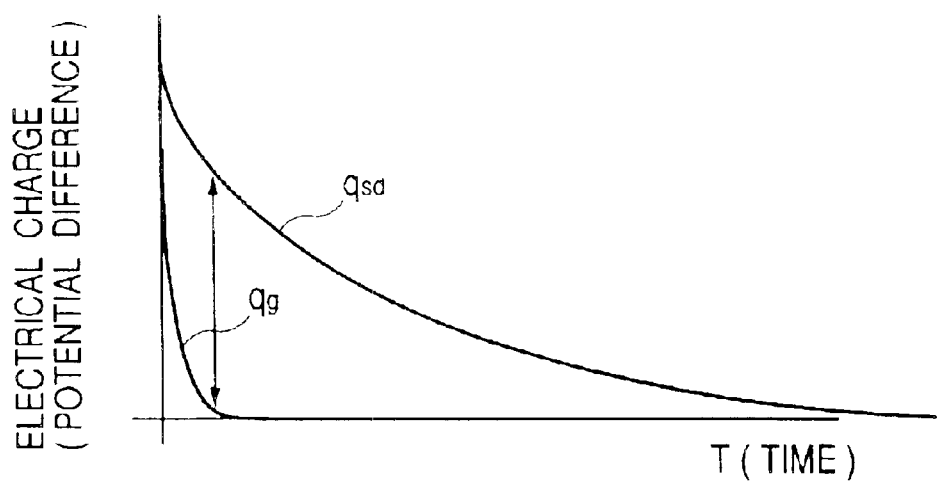
FIG. 33 is a graph showing time intervals required to discharge electrical charges on the input and output sides of the peripheral circuit shown in FIG. 32.

FIG. 32 shows an inverter INV31 driven by a power source VCC31. The inverter INV31 is configured in such a manner that a p channel MOS.FET Q31a and an n channel MOS.FET Q31b are electrically connected in series between the power source VCC31 and a ground source GND. Symbol qg indicate electrical charges borne on the input interconnection side (including metal wiring and gate electrodes) of the inverter INV31. Symbol qg indicates electrical charges borne on the output side (on the side of a semiconductor region (diffused layer) for a well and sources drains on the semiconductor substrate side in which the MOS.FETs Q2a and Q2b of the inverter INV1 are disposed). When the external terminal 2 is grounded in this construction, the electrical charges qg on the input sides of the MOS.FETs Q31a and Q31b are rapidly discharged. However, the electrical charges qSd on the output interconnection sides of the MOS.FETs Q31a and Q31b are slowly discharged through the semiconductor substrate and the power source VCC31. The relationship between the time required to discharge the electrical charges and the amount of electrical charges (potential difference) in this case is shown in FIG. 33. It is understood that a large difference in discharge time occurs between the electrical charges qg on the input sides of the MOS.FETs Q31a and Q31b and the electrical charges qSd on the output sides thereof. Due to the difference in discharge time, a high potential difference is instantaneously applied to the gate insulating films of the MOS.FETs Q31a and Q31b, so that the gate insulating films are subjected to breakdown.

Figure 11:
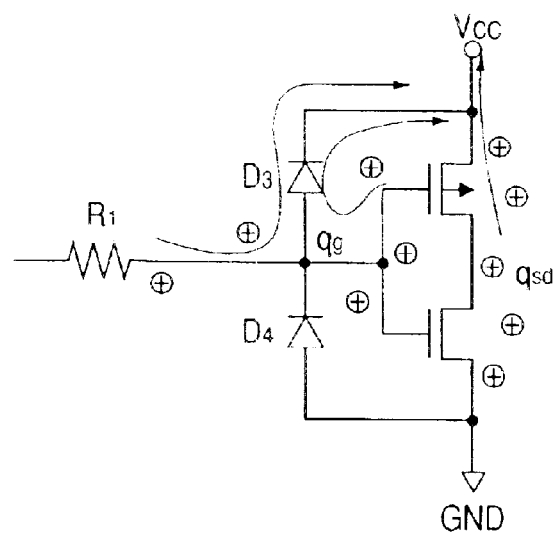
FIG. 11 is a diagram for describing the operation of a protection circuit in a peripheral circuit of the semiconductor integrated circuit device shown in FIG. 10.
Figure 12:
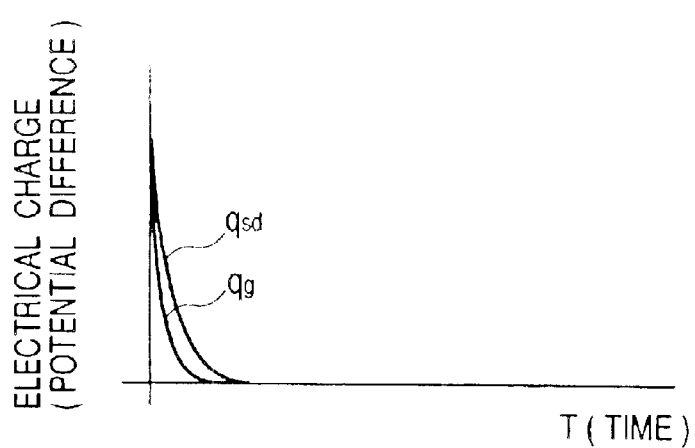
FIG. 12 is a graph showing time intervals required to discharge electrical charges on the input and output sides of the peripheral circuit shown in FIG. 11.

Thus, the present embodiment 3 has a structure in which, as shown in FIGS. 10 and 11, when the external terminal 2 is grounded, the electrical charges qsd borne on the output interconnection side of the inverter INV1 can be rapidly discharged to the input side through the diodes D3 and D4 by electrically connecting the resistor R1 and the diodes D3 and D4 for the protection circuit to the input stage of the inverter INV1. As a result, the difference in discharge time between the electrical charges qg on the input interconnection side of the inverter INV1 and the electrical charges qSd on the output side of the inverter INV1 can be lessened. Thus, since the high voltage can be prevented from being instantaneously applied to the gate insulating films of the MOS.FETs Q2a and Q2b in the inverter INV1 due to the difference in discharge time, the gate insulating films can be prevented from breaking down, and the yield and reliability of the semiconductor integrated circuit device can be improved.

Figure 13:
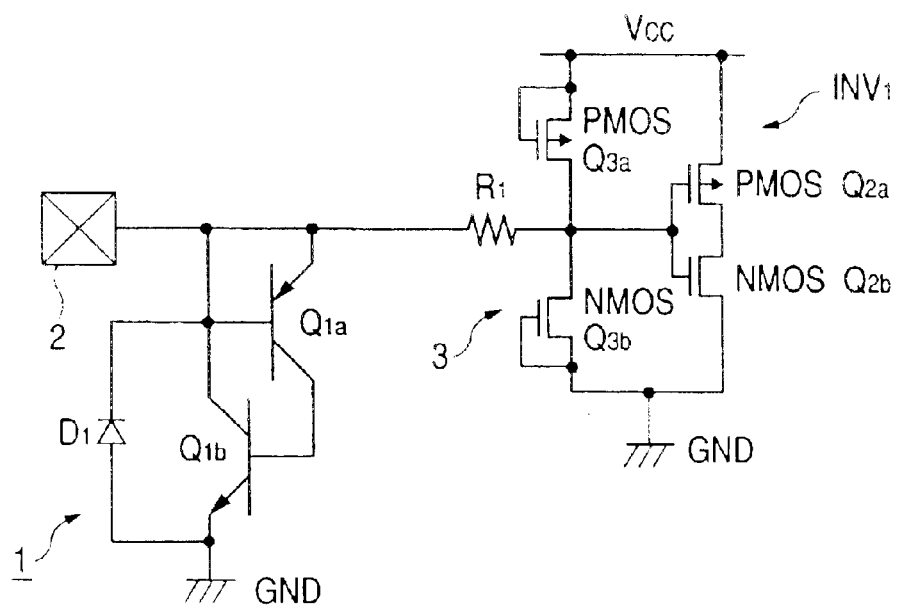
FIG. 13 is a fragmentary circuit diagram showing a semiconductor integrated circuit device according to a still further embodiment of the present invention.

Such protection circuit elements in the peripheral circuit 3 are not necessarily limited to the diodes D3 and D4. Various changes can be made thereto in place of the diodes D3 and D4 shown in FIG. 10, for example, a p channel MOS.FET Q3a and an n channel MOS.FET Q3b may be diode-connected as shown in FIG. 13. Since, in this case, each MOS.FET can provide a breakdown voltage lower by about IV than that of each diode, the MOS.FETs result in a structure which can easily perform the desired charge discharging operation. Accordingly, the discharge of electrical charges can be rapidly performed.

Further, bipolar transistors may be diode-connected in place of the diodes D3 and D4 shown in FIG. 10. Since the bipolar transistors are higher than the diodes in driving capability in this case, the bipolar transistors result in a structure which is capable of rapidly performing the desired discharge of electrical charges.

Figure 14:
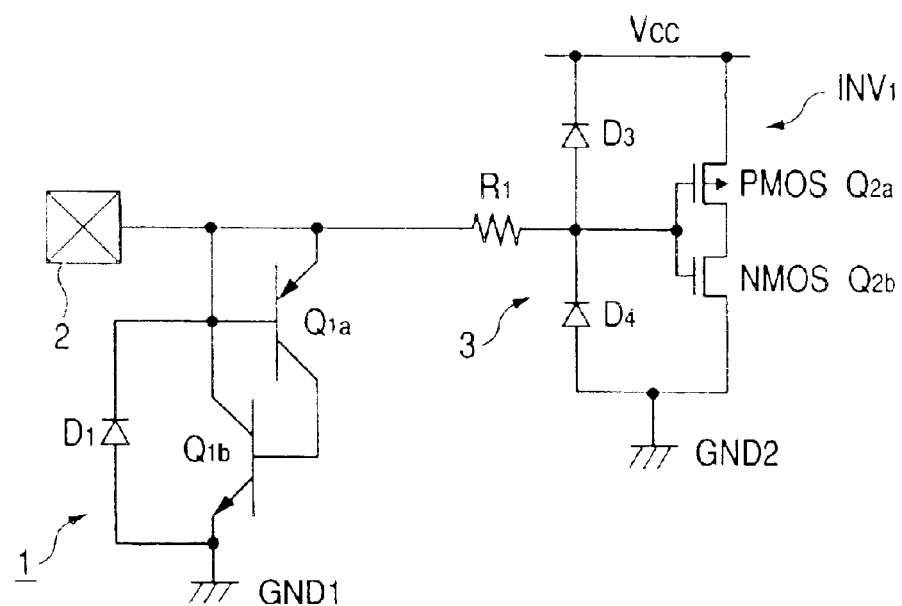
FIG. 14 is a fragmentary circuit diagram illustrating a semiconductor integrated circuit device according to a still further embodiment of the present invention.

As shown in FIG. 14, a ground source GND1 used for a diode D1 and bipolar transistors Q1a and Q1b in a protection circuit h and a ground source GND2 used for diodes D3 and D4 and an inverter INV1 in a peripheral circuit 3 are electrically separated from each other. That is, ground source voltages are supplied to the protection circuit 1 and the peripheral circuit 3 through separate ground source interconnections respectively. The ground sources GND1 and GND2 may be equal to or different in potential from each other. Owing to the separation of the ground sources GND1 and GND2 from each other in this way, the potential of the ground source in the other circuit can be prevented from varying due to a variation in potential developed on one circuit side.

Figure 15:
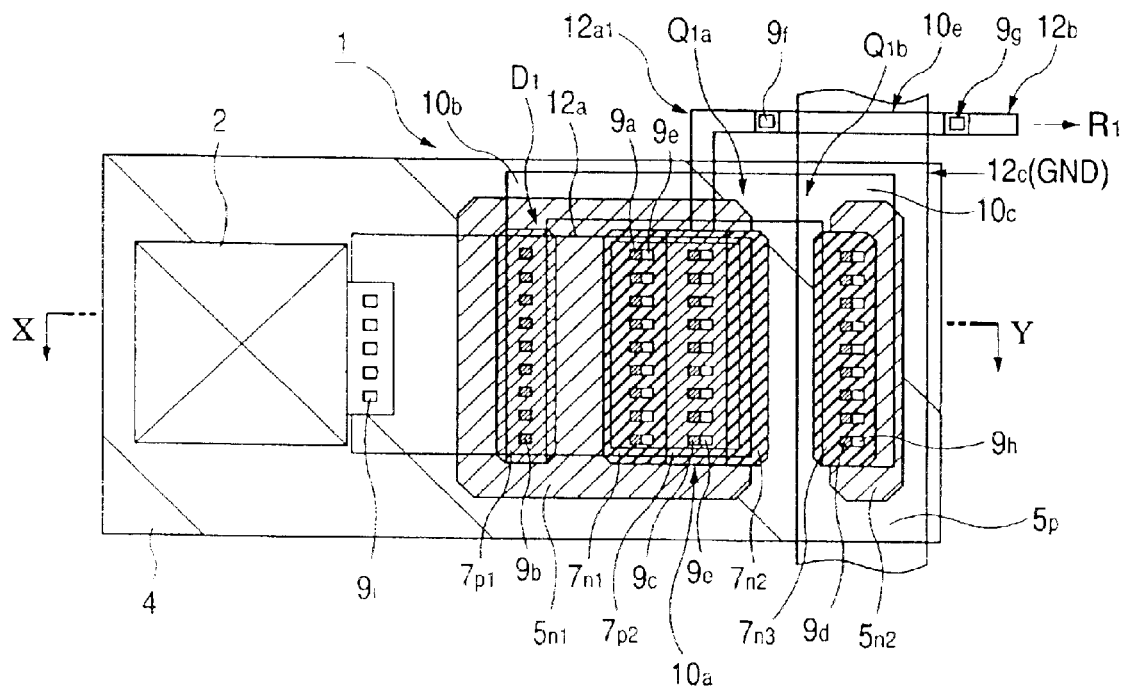
FIG. 15 is a plan view showing the protection circuit of the semiconductor integrated circuit device shown in FIG. 10.
Figure 16:
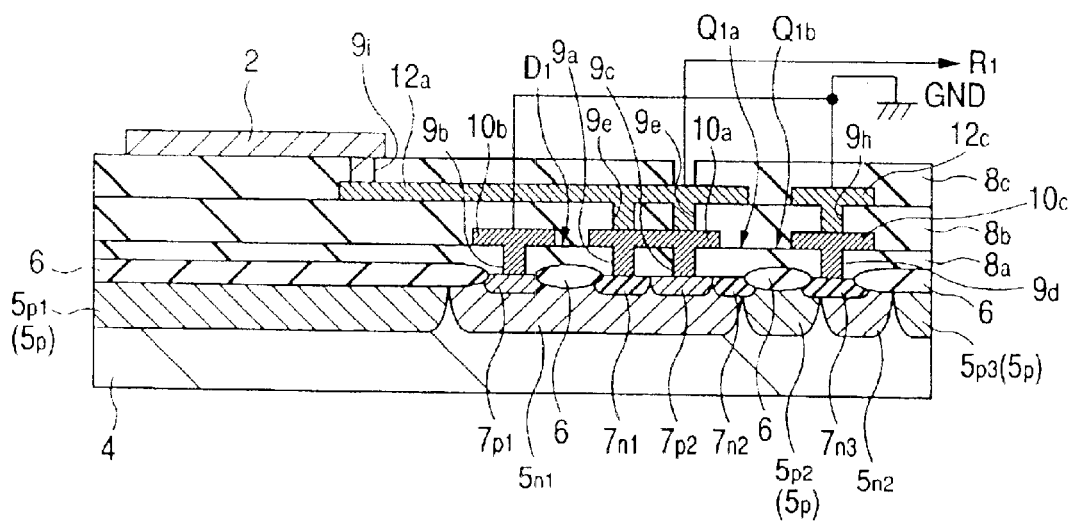
FIG. 16 is a cross-sectional view taken along line, X-Y of FIG. 15.

A device structure corresponding to the circuit portion of FIG. 10 will next be described with reference to FIGS. 15 through 17. FIGS. 15 and 16 are, respectively, a plan view corresponding to the protection circuit 1 shown in FIG. 10 and a cross-sectional view taken along line X-Y thereof. The same hatching is affixed to corresponding regions to make it easy to understand the drawings in FIGS. 15 and 16.

The device structure of the protection circuit 1 is also basically identical to that in the embodiment 1. In a manner similar to the embodiment 1, even in the case of the present embodiment 3, a p-type semiconductor region 7p2, serving as the emitter of a pnp bipolar transistor Q1a constituting a thyristor, and a p-type semiconductor region 7p1 of the diode D1 are provided within one n well 5n1 in a state of being close to each other. The interconnection or wiring structure (wiring layout and wiring connections or the like) will now be described in detail. The bipolar transistors, Q1a and Q1b constituting the thyristor are electrically connected to an external terminal 2 through a first layer interconnection 10a and a second layer interconnection 12a. A pattern configuration of the first layer interconnection 10a is shaped in rectangular form so as to cover an $n^+$-type semiconductor region 7n1 and the $p^+$-type semiconductor region 7p2. Further, first layer interconnections 10b and 10c are molded in one piece and their pattern configurations are formed in a plane inverted U-shaped frame so as to cover the $p^+$-type semiconductor region 7p1 and an $n^+$-type semiconductor region 7n3 and so that the first layer interconnections lob and 10c are electrically connected to one another. These first layer interconnections 10a through 10c are covered with an interlayer insulator 8b. The interlayer insulator 8b is made of, for example, $SiO_2$ or the like and second layer interconnections 12a through 12c each composed of, for example, Al or an Al—Si—Cu alloy are formed in an upper surface thereof.

The second layer interconnection 12a is electrically connected to the first layer connecting holes 9e. The pattern configuration of the second layer interconnection 12a is basically shaped in rectangular form so as to cover a part of an n$^+$-type semiconductor region 7n2, the p$^+$-type semiconductor region 7p2, the n$^+$-type semiconductor region 7n1, the p$^+$-type semiconductor region 7p1 and a part of a p-well 5p1. Incidentally, the second layer interconnection 12a has a pattern portion 12a1 which is narrow in width, and which is integrally provided at a portion thereof. The pattern portion 12a1 is shaped so that a portion of the second layer interconnection 12a extends in an upward direction as seen in FIG. 15 and its leading end is bent in a direction perpendicular to its extending direction and slightly extends in a right direction as seen in FIG. 15. The pattern portion 12a1 is electrically connected to one end of a first layer interconnection 10e through a connecting hole 9f. Further, the other end of the first layer interconnection 10e is electrically connected to the second layer interconnection 12b through a connection hole 9g. The second layer interconnection 12b is electrically connected to the protection circuit resistor R1 described in FIG. 10. Further, the second layer interconnection 12c is electrically connected to the first layer interconnection 10c through connecting holes 9h. The second layer interconnection 12c is an interconnection for supplying the ground source GND. The pattern configuration thereof is formed relatively wide and is shaped into a band or strip pattern so as to cover a portion of the n$^+$-type semiconductor region 7n2 and portions of an n well 5n2 and a p well 5p. These second layer interconnections 12a through 12c are covered with an interlayer insulator 8c. The interlayer insulator 8c is made of, for example, SiO$_2$ or the like. The external terminal 2 made of, for example, Al or Al—Si—Cu alloy is formed on an upper surface of the interlayer insulator 8c. Incidentally, the second layer interconnection 12c is electrically connected to the ground source GND.

The external terminal 2 is electrically connected to the second layer interconnection 12a through connecting holes 9i. The external terminal 2 is disposed above the field insulating film 6 and a pattern configuration thereof is shaped substantially in a square form. However, a portion (corresponding to a position where the connecting holes 9i are disposed) where the external terminal 2 is connected to the second layer interconnection 12a partially extends for the corresponding connection. Incidentally, bonding wires made of, for example, gold (Au) or Al or the like, are directly joined to the external terminal 2. The external terminal 2 is electrically connected to leads of a package through the bonding wires. There may be cases in which the external terminal 2 is electrically connected to the leads of the package through bump electrodes in place of the bonding wires. Incidentally, a portion of the external terminal 2 is covered with a surface protective coat or film. The surface protective film is composed of, for example, a single layer film of SiO$_2$, a layered film obtained by stacking silicon nitride on SiO$_2$ or a layered film obtained by stacking a polyimide resin on these films.

Figure 17:
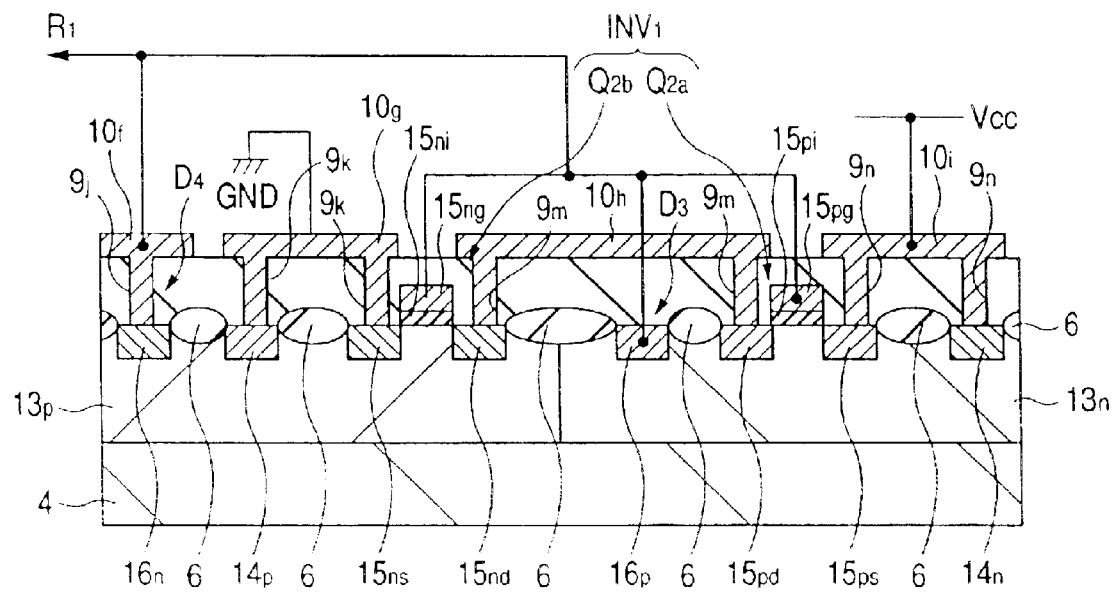
FIG. 17 is across-sectional view showing the peripheral circuit of the semiconductor integrated circuit device shown in FIG. 10.

On the other hand, FIG. 17 is a cross-sectional view corresponding to the protection circuit shown in FIG. 10.

As shown in FIG. 17, an n well 13n and a p well 13p are provided at an upper portion of a semiconductor substrate 4. The n well 13n and the p well 13p are formed within a region different from that for the above-described n well 5n1 and the p well 5p (see FIGS. 15 and 16) and are also electrically separated from one another. For example, phosphorus or arsenic (As) corresponding to an n-type impurity is introduced into the n well 13n. Further, the above-described p channel MOS.FET Q2a, the above-described diode D3 and an n-type semiconductor region 14n for the supply of a well potential are formed within a region for the n well 13n. For example, boron corresponding to a p-type impurity is introduced into the p well 13p. Further, the above-described n channel MOS.FET Q2b, the above-described diode D4 and a p-type semiconductor region 14p for the supply of a well potential are formed within a region for the p well 13p. Thus, a CMOS (Complementary MOS) circuit type inverter INV1 is constructed of the MOS.FETs Q2a and Q2b. Incidentally, for example, boron corresponding to the p-type impurity is introduced into the p-type semiconductor region 14p for the supply of the well potential, whereas, for example, phosphorus or As corresponding to the n-type impurity is introduced into the n-type semiconductor region 14n for the supply of the well potential.

The p channel MOS.FET Q2a constituting the inverter INV1 has a pair of p$^+$-type semiconductor regions 15ps and 15pd formed in an upper portion of the n well 13n so as to be separated from each other, a gate insulating film 15pi formed on the semiconductor substrate 4 and a gate electrode 15pg formed on the gate insulating film 15pi. Incidentally, a channel region for the MOS.FET Q2a is formed between the pair of p$^+$-type semiconductor regions 15ps and 15pd.

For example, boron corresponding to the p-type impurity is introduced into the p$^+$-type semiconductor regions 15ps and 15pd. The p$^+$-type semiconductor region 15ps is electrically connected to a power source VCC on the high potential side. Incidentally, a diode D5 is formed in a region in which the n well 13n makes contact with the semiconductor substrate 4.

The gate insulating film is made of, for example, SiO$_2$. The gate electrode 15pg is made of, for example, polysilicon having a low resistance. However, the gate electrode 15pg is not limited to being formed of a single film of low-resistance polysilicon. The gate electrode 15pg may be configured as a structure wherein a suicide film such as a tungsten silicide film or the like is stacked on the low-resistance polysilicon. As an alternative to this, the gate electrode 15pg may be formed as a structure wherein a metal film such as a tungsten film or the like is stacked on the low-resistance polysilicon with a barrier metal film or the like such as a titanium nitride film or the like interposed therebetween.

The diode D3 formed within the same n well 13n as the MOS.FET Q2a is formed in a region in which the n well 13n makes contact with a p$^+$-type semiconductor region 16p formed in its upper portion. One terminal of the diode D3 is electrically connected to the gate electrodes 15ng and 15pg of the inverter INV1, whereas the other terminal thereof is electrically connected to the high potential power source VCC through the n well 13n. Incidentally, for example, boron corresponding to the p-type impurity is introduced into the p$^+$-type semiconductor region 16p.

On the other hand, the n channel. MOS.FET Q2b constituting the inverter INV1 has a pair of n$^+$-type semiconductor regions 15ns and 15nd formed in an upper portion of the p well 13p so as to be separated from each other, a gate insulating film 15ni formed on the semiconductor substrate 4 and a gate electrode 15ng formed on the gate insulating film 15ni. Incidentally, a channel region for the MOS.FET Q2b is formed between the pair of n$^+$-type semiconductor regions 15ns and 15nd.

For example, phosphorus or As corresponding to the n-type impurity is introduced into the n⁺-type semiconductor regions 15ns and 15nd. The n⁺-type semiconductor region 15ns is electrically connected to a ground source GND. The gate insulating film 15ni is made of, for example, $SiO_2$. The gate electrode 15ng is composed of, for example, polysilicon having a low resistance. However, the gate electrode 15ng is not limited to being formed of a single film of low-resistance polysilicon. The gate electrode 15ng may be configured as a structure wherein a suicide film such as a tungsten silicide or the like is stacked on the low-resistance polysilicon. As an alternative to this, the gate electrode 15ng may be formed as a structure wherein a metal film such as a tungsten film or the like is stacked on the low-resistance polysilicon with a barrier, metal film or the like such as a titanium nitride film or the like interposed therebetween. Incidentally, the gate electrode 15ng is electrically connected to the gate electrode 15pg an n⁺-type semiconductor region 16n, the p⁺-type semiconductor region 16p and the resistor R1 through interconnections.

The diode D4 formed within the same P well 13p as the MOS.FET Q2b is formed in a region in which the p well 13p makes contact with the n⁺-type semiconductor region 16n formed in its upper portion. The diode D4 is electrically connected to the resistor R1 through a first layer interconnection 10f, whereas the other terminal thereof is electrically connected to the ground source GND through the p well 13p. Incidentally, for example, phosphorus or As corresponding to the n-type impurity is introduced into the n⁺-type semiconductor region 16n.

An interlayer insulator 8a is formed on such a semiconductor substrate 4 so that the MOS.FETs Q2a and Q2b, diodes D3 and D4, etc. are covered therewith. The first layer interconnection 10f and first layer interconnections 10h through 10i each composed of, for example, Al or an Al—Si—Cu alloy or the like are formed on the interlayer insulator 8a. The first layer interconnection 10f is electrically connected to the n⁺-type semiconductor region 16n through connecting holes 9j. The first layer interconnection 10g is electrically connected to the p⁺-type semiconductor region 14p and the n⁺-type semiconductor region 15ns through connecting holes 9k. The first layer interconnection 10g is electrically connected to the ground source GND. The first layer interconnection 10h is electrically connected to the n⁺-type semiconductor region 15nd and the p⁺-type semiconductor region 15pd through connecting holes 9m. The first layer interconnection 10h constitutes an output interconnection for the inverter INV1 and is electrically connected to an internal circuit of the semiconductor integrated circuit device. Further, the first layer interconnection 10i is electrically connected to the semiconductor region 15ps and the n⁺-type semiconductor region 14n through connecting holes 9n. The first layer interconnection 10i is electrically connected to the high potential power source VCC.

The embodiment 3 described above can bring about the same advantageous effects as those obtained in the embodiment 1.

[Embodiment 4]

Figure 18:
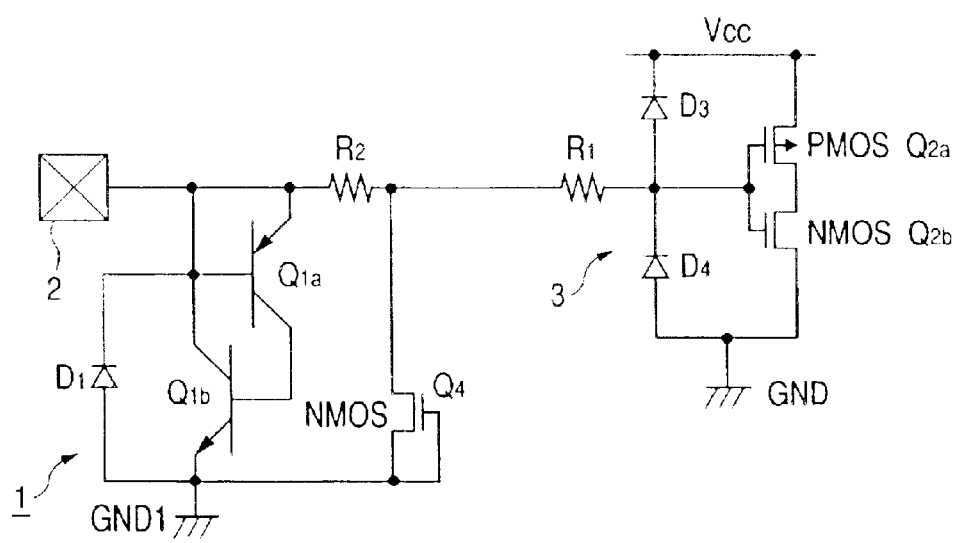
FIG. 18 is a circuit diagram showing a semiconductor integrated circuit device according to a still further embodiment of the present invention.

A semiconductor integrated circuit device according to an embodiment 4 of the present invention will next be described with reference to FIGS. 18 through 20.

The circuit structure of the semiconductor integrated circuit device according to the present embodiment 4 will first be explained with reference to FIG. 18. Since the peripheral circuit 3 is identical in circuit configuration to that in the previous embodiment 3 (see FIGS. 10, 13 and 14), its detailed description will be omitted.

In the present embodiment 4, a resistor R2 and an n channel MOS.FET Q4 are added to a protection circuit 1 having a diode D1 and a thyristor (bipolar transistors Q1a and Q1b). That is, the resistors R1 and R2 are interposed between an external terminal 2 and the input of an inverter INV1 in the peripheral circuit 3. Further, the n channel MOS.FET Q4 is electrically connected between an interconnection for connecting the resistors R1 and R2 to each other and a ground source GND in a state in which a gate electrode thereof is connected to the ground source GND. Those elements and connections other than the above are identical to those in the embodiment 3. The emitter region of the bipolar transistor Q1a constituting a thyristor and p type semiconductor region of the diode D1 are disposed within the same well and the n channel MOS.FET Q4 is disposed in the vicinity of the thyristor.

The resistor R2 has the function of limiting the amount of current that flows on the MOS.FET Q4 side and preventing gate breakdown of the MOS.FET Q4. Further, the MOS.FET Q4 has the function of setting an emitter electrode of the bipolar transistor Q1b constituting the thyristor of the protection circuit 1 in the forward direction so as to inject holes into its base electrode, thereby making it easy to activate the bipolar transistor Q1b to urge the thyristor to operate. Incidentally, the MOS.FET Q4 is a trigger element for turning on the thyristor, but not an element for allowing an excessive current or overcurrent on the external terminal 2 side to escape toward the ground source GND through the MOS.FET Q4. Therefore, the current that flows through the MOS.FET Q4 is restricted by the resistor R2. The ground sources GND for the thyristor, diode D1 and MOS.FET Q4 of the protection circuit 1 are the same and are not classified into a separate form in particular.

A device structure associated with the protection circuit 1 shown in FIG. 18 will next be described with reference to FIGS. 19 and 20. FIGS. 19 and 20 are, respectively, a plan view corresponding to the protection circuit 1 shown in FIG. 18 and a cross-sectional view taken along line X-Y thereof. The same hatching is affixed to corresponding regions to make it easy to understand the drawings in FIGS. 19 and 20.

The device structure employed in the present embodiment 4 is basically identical to that employed in the embodiments 1 and 3 except for the addition of the n channel MOS.FET Q4. The n channel MOS.FET Q4 has a pair of n⁺-type semiconductor regions 7n3 and 7n4 formed in an upper portion of a semiconductor substrate 4 a gate insulating film 17n1 formed on the semiconductor substrate 4, and a gate electrode 17ng formed on the gate insulating film 17n1. The n⁺-type semiconductor regions 7n3 and 7n4 are semiconductor regions for the source drain of the MOS.FET Q4 and are form ed by introducing phosphorus or As corresponding to an n-type impurity thereto. One n⁺-type semiconductor region 7n3 is a region that constitutes a part of the bipolar transistor Q1b as described above. Further, the n⁺-type semiconductor region 7n3 also corresponds to a part of the MOS.FET Q4 in the present embodiment 4 and is formed so as to extend across a p well 5p2, an n well 5n2 and a p well 5p3. The n⁺-type semiconductor region 7n3 is electrically connected to a first layer interconnection 10b, the gate electrode 17ng and the ground source GND through a first layer interconnection 10c and a second layer interconnection 12c. Further, the other n⁺-type semiconductor region 7n4 is formed within the p well 5p3. The n⁺-type semiconductor region 7n4 is electrically connected to a first layer interconnection 10j through connecting holes 9p. Further, the n+-type semiconductor region 7n4 is also electrically connected to the interconnection between the resistors R1 and R2 with the first layer interconnection 10j or the like interposed therebetween. Incidentally, a channel region for the MOS.FET Q4 is formed in a region for the p well 5p3 between the pair of n+-type semiconductor regions 7n3 and 7n4.

The gate insulating film 17n1 of the MOS.FET Q4 is made up of, for example, SiO$_2$ and has a film thickness equal to that of the gate insulating film of each of the PMOS Q2a and an NMOS Q2b. The gate electrode 17ng is made of, for example, low-resistance polysilicon. However, the gate electrode 17ng is not limited to being formed of a single film of the low-resistance polysilicon. The gate electrode 17ng may be configured as a structure wherein a silicide film such as a tungsten silicide or the like is stacked on the low-resistance polysilicon. As an alternative to this, the gate electrode 17ng maybe formed as a structure wherein a metal film such as a tungsten film or the like is stacked on the low-resistance polysilicon with a barrier metal film or the like such as a titanium nitride film or the like interposed therebetween.

A pattern portion 12a1 of a second layer interconnection 12a is electrically connected to a first layer interconnection through a connecting hole 9r. Further, the pattern portion 12a1 is electrically connected to one end of the resistor R2 through a connecting hole 9s1. Resistor R2 is composed of, for example, the low-resistance polysilicon and is set to a predetermined sheet resistance value. The other end of the resistor R2 is electrically connected to the first layer interconnection 10j through a connecting hole 9s2. Further, the other end thereof is electrically connected to a second layer interconnection 12d through a connecting hole 9t. The second layer interconnection 12c for the ground source GND is electrically connected to the first layer interconnections 10b and 10c through connecting holes 9h. Further, portions of the first layer interconnections 10b and 10c are electrically connected to the gate electrode 17ng of the MOS.FET Q4 through a connecting hole 9u. Thus, the gate electrode 17ng is electrically connected to the n+-type semiconductor region 7n3, p+-type semiconductor region 7p1 and ground source GND.

According to the present embodiment 4 described above, the following advantageous effects can be obtained in addition to the advantageous effects obtained in the previous embodiment 1. That is, the provision of the MOS.FET Q4 permits quick driving of the thyristor constituting the protection circuit 1 and allows an overcurrent on the external terminal 2 side to rapidly escape to the ground source GND side. It is thus possible to improve the ESD characteristic and enhance the yield and reliability of the semiconductor integrated circuit device.

[Embodiment 5]

A semiconductor integrated circuit device according to an embodiment 5 of the present invention will next be described with reference to FIGS. 21 through 23.

Figure 21:
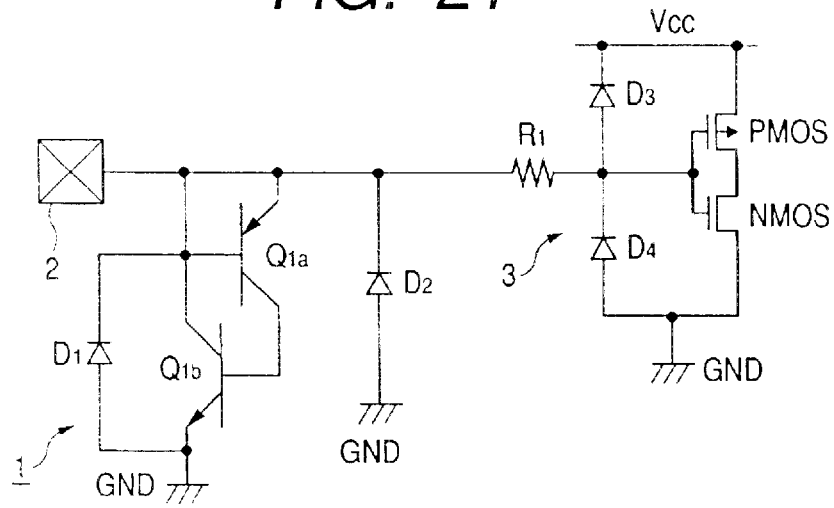
FIG. 21 is a circuit diagram depicting a semiconductor integrated circuit device according to a still further embodiment of the present invention.

A circuit structure of the semiconductor integrated circuit device according to the embodiment 5 is shown in FIG. 21. Since the protection circuit 1 is identical in circuit configuration to that employed in the previous embodiment 2 (see FIG. 7), its detailed description will be omitted. The emitter region of the bipolar transistor Q1a constituting a thyristor and p type semiconductor region of the diode D1 are disposed within the same well and a diode D2 is disposed in the neighborhood of the thyristor. Further, a common ground source is used as the ground sources GND for the diodes D1 and D2 in a manner similar to the previous embodiment 2.

Since a peripheral circuit 3 provided posterior to the protection circuit 1 is also identical to that employed in the previous embodiment 3 (see–FIGS. 11, 13 and 14), its detailed description will be omitted.

A device structure corresponding to a circuit portion shown in FIG. 21 will be described with reference to FIGS. 22 and 23. FIGS. 22 and 23 are, respectively, a plan view corresponding to the protection circuit 1 shown in FIG. 21 and a cross-sectional view taken along line X-Y thereof. Incidentally, corresponding hatching is affixed to the same regions to make it easy to understand the drawings in FIGS. 22 and 23.

The device structure of the protection circuit 1 is also basically identical to that employed in the embodiment 2. In a manner similar to the embodiment 2, even in the case of the present embodiment 5 in particular, the p type semiconductor region of the diode D1 is provided within the same n well 5n1 as the emitter region of the bipolar transistors Q1a in a state of being close to the bipolar transistors Q1a and Q1b (thyristor). Further, a p+-type semiconductor region 7p3 is formed in an upper portion of a p well 5p on a semiconductor substrate 4 in frame form so as to surround the diode D1 and the bipolar transistors Q1a and Q1b whereby a diode D2 is provided.

Further, the present embodiment 5 is also substantially Identical in wiring structure to the embodiment 3. In the present embodiment 5 In particular, a frame-shaped first layer interconnection 10k is provided at an upper layer of the p+-type semiconductor region 7p3 along the shape of the p+-type semiconductor region 7p3. The first layer interconnection 10k is composed of, for example, Al or an Al—Si—Cu alloy and is electrically connected to the p+-type semiconductor region 7p3 through connecting holes 9v. The connecting holes 9v are disposed in plural form along the line of the first layer interconnection 10k. Further, a second layer interconnection 12c is a broad ground source interconnection for supplying the ground source GND in a manner similar to the embodiment 3. However, the present interconnection is electrically connected to a first layer interconnection 10c and the first layer interconnection 10k through connecting holes 9h and 9w and serves as the ground source interconnection common to the diodes D1 and D2.

The above-described embodiment 5 can also obtain the same advantageous effects as those obtained in the previous embodiment 2. That is, in the present embodiment 5, an excessive current or overcurrent can be promptly discharged to the ground potential GND through both of the diodes D1 and D2 when a negative overvoltage is applied to an external terminal 2.

[Embodiment 6]

Figure 24:
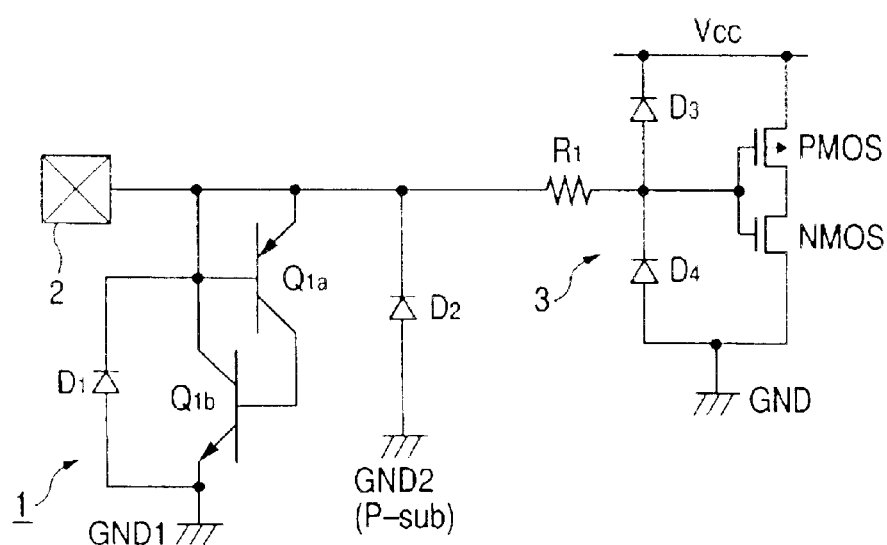
FIG. 24 is a circuit diagram illustrating a semiconductor integrated circuit device according to a still further embodiment of the present invention.
Figure 25:
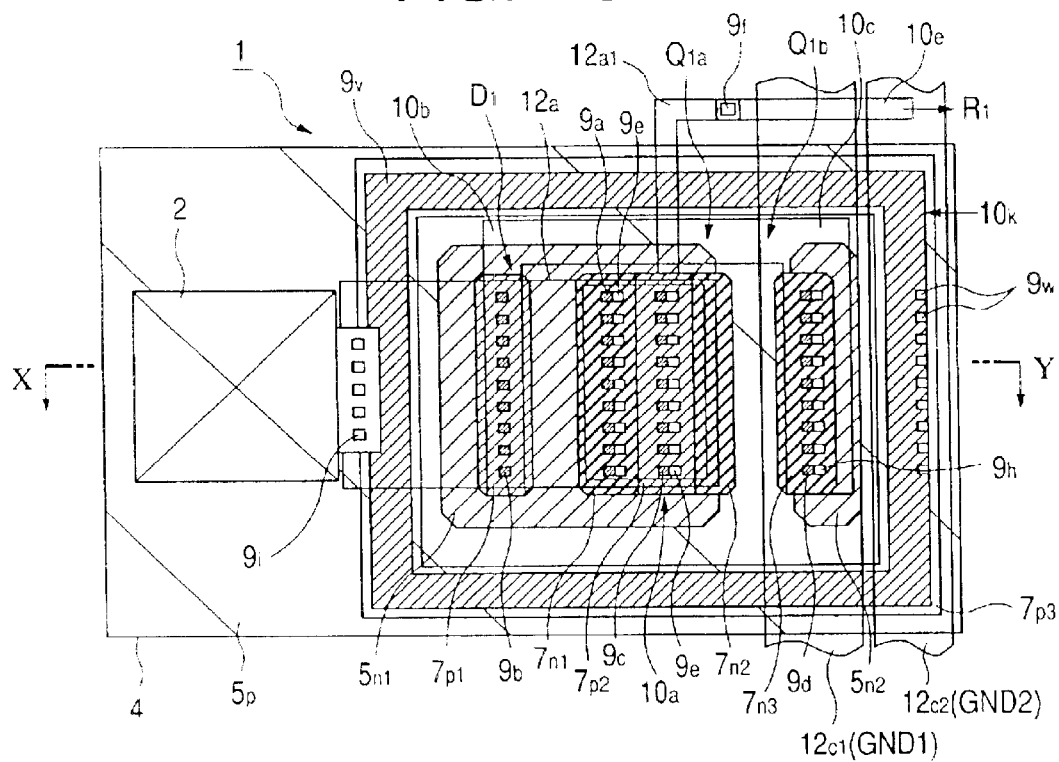
FIG. 25 is a plan view showing a protection circuit employed in the semiconductor integrated circuit device shown in FIG. 24.
Figure 26:
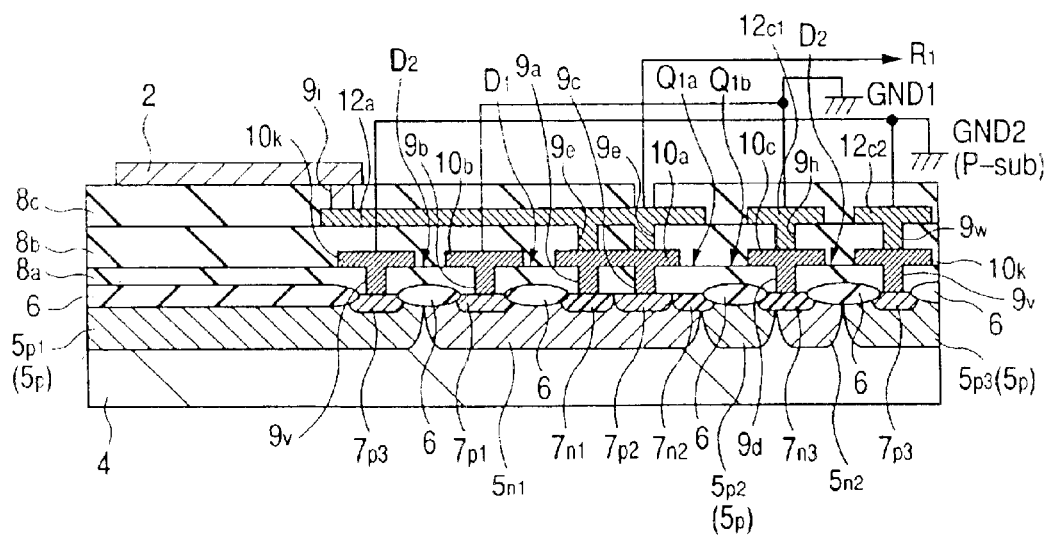
FIG. 26 is a cross-sectional view taken along line X-Y of FIG. 25.

A semiconductor integrated circuit device according to an embodiment 6 of the present invention will next be described with reference to FIGS. 24 through 26. A circuit structure of the semiconductor integrated circuit device according to the present embodiment 6 is shown in FIG. 24. A protection circuit 1 is substantially identical in circuit configuration to that employed in the previous embodiment 2 (see FIG. 7). However, ground sources GND1 and GND2 are respectively separately used for a thyristor (bipolar transistors Q1a and Q1b) and a diode D1, and a diode D2 in the present embodiment 6. The ground sources GND1 and GND2 are electrically, separated from each other. The present embodiment 6 shows the case in which the present invention is applied to, for example, a product for setting the potential at a semiconductor substrate to a negative potential. Although the invention is not so limited in particular, the ground source GND1 is set to, for example, about 0 (zero) V and the ground source GND2 is set to, for example, about −1.5V.

The emitter region of the bipolar transistor Q1a, constituting the thyristor and the p type semiconductor region of the diode D1 are disposed within the same well and the diode D2 is disposed in the neighborhood of the thyristor. Since a peripheral circuit 3 provided posterior to the protection circuit 1 is identical to that employed in the embodiment 3 (see FIGS. 10, 13 and 14), its detailed description will be omitted.

A device structure corresponding to a circuit portion shown in FIG. 24 will next be described with reference to FIGS. 25 and 26. FIGS. 25 and 26 are, respectively, a plan view corresponding to the protection circuit 1 shown in FIG. 24 and a cross-sectional view taken along line X-Y thereof. Incidentally, corresponding hatching is affixed to the same regions to make it easy to understand the drawings in FIGS. 25 and 26.

The device structure of the protection circuit 1 is also basically identical to that employed in the embodiment 2. In a manner similar to the embodiments 2 and 5, even in the case of the present embodiment 6 in particular the p type semiconductor region of the diode D1 is provided within the same n well 5n1 as the emitter region for bipolar transistor Q1a in a state of where the bipolar transistors Q1a and Q1b (thyristor) are close to each other. Further, a p$^+$-type semiconductor region 7p3 is formed in an upper portion of a p well 5p on a semiconductor substrate 4 in frame form so as to surround the diode D1 and the bipolar transistors Q1a and Q1b whereby a diode D2 is provided.

Particularly, the present embodiment 6 is one in which consideration is given to the case where the present invention is applied to, for example, a product for setting the potential at the semiconductor substrate 4 to a negative potential by an internal power source. Since the diode D2 is placed within the p well 5p in this case, the diode D2 is electrically connected to the ground source GND2 set by the negative potential at the semiconductor substrate 4, i.e., the internal power source such a structure will cause a situation in which, since the ground source GND2 is produced from the internal power source, the above-described overcurrent cannot escape to the ground source GND2 side through the diode D2.

However, since the diode D1 of the protection circuit is provided within the n well 5n1, which is electrically separated from the semiconductor substrate 4 in the present embodiment 6, the diode D1 can be electrically connected to the ground source GND1 set by an external power source. Thus, even if a negative overvoltage is applied to an external terminal 2 an excessive current or overcurrent produced by its application can be promptly discharged to the ground source GND1 through the diode D1. Therefore, the ESD resistance can be enhanced even in the case of a product for setting the potential at the semiconductor substrate 4 to a negative potential by the internal power source.

In such a wiring structure employed in the present embodiment 6, second layer interconnections 12c1 and 12c2 for the two ground sources are placed in a second wired layer. The second layer interconnection 12c1 is a ground source interconnection for supplying the ground source GND1, which electrically connected to a first layer interconnection 10b through connecting holes 9h. Further, the second layer interconnection 12c1 is also electrically connected to the diode D1, and the bipolar transistors Q1a and Q1b (thyristor) through the first layer interconnection 10b. Further, the second layer interconnection 12c2 is a ground source interconnection for supplying the ground source GND2, which is electrically connected to a first layer interconnection 10k through connecting holes 9w. Further, the second layer interconnection 12c2 is also electrically connected to the diode D2 through the first layer interconnection 10k.

Thus, according to the present embodiment 6, even if the present invention is applied to a product for setting the potential of the semiconductor substrate 4 to a predetermined potential, the present embodiment can obtain the same advantageous effects as those obtained in the embodiment 2.

[Embodiment 7]

Figure 27:
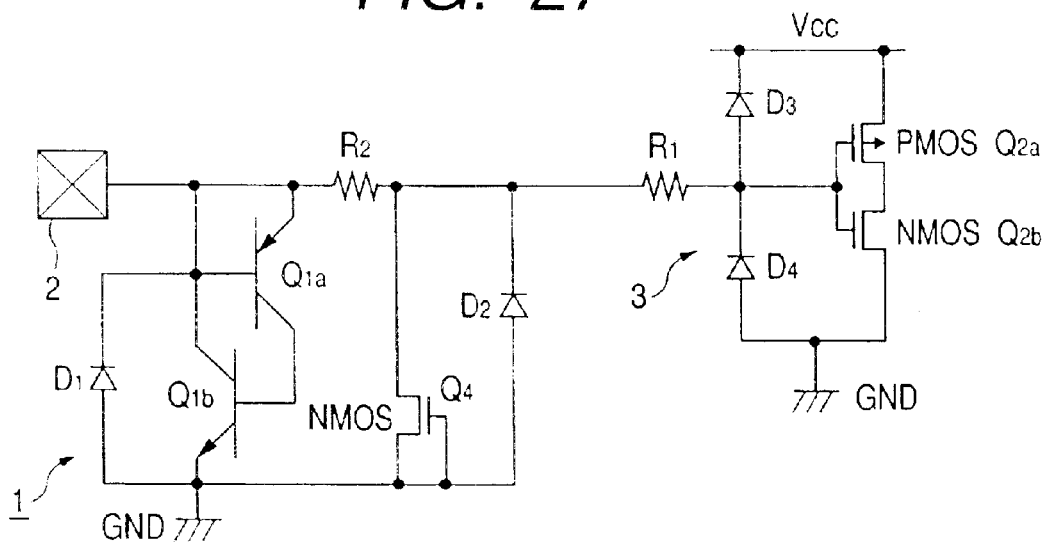
FIG. 27 is a circuit diagram illustrating a semiconductor integrated circuit device according to a still further embodiment of the present invention.

A semiconductor integrated circuit device according to an embodiment 7 of the present invention will next be described with reference to FIG. 27. The protection circuit 1 employed in the present embodiment 7 is a combination of the embodiment 4 (see FIG. 18) and the embodiment 5 (see FIG. 21), and has a resistor R2, an n channel MOS.FET Q4 and a diode D2 in addition to the thyristor (bipolar transistors Q1a and Q1b) and the diode D1. That is, in the present embodiment 7, the resistors R1 and R2 are interposed between an external terminal 2 and the input of an inverter INV1 in a peripheral circuit 3. The n channel MOS.FET Q4 is electrically connected between an interconnection for making a connection between the resistors R1 and R2 and a ground source GND in a state in which a gate electrode thereof is connected to the ground source GND. Further, the diode D2 is electrically connected between the interconnection for establishing the connection between the resistors R1 and R2 and the ground source GND.

The emitter region of the bipolar transistor Q1a constituting the thyristor and the p$^+$-type semiconductor region of the diode D1 are disposed within the same well, and the MOS.FET Q4 and the diode D2 are disposed in the neighborhood of the thyristor. Since a peripheral circuit 3 provided posterior to the protection circuit 1 is identical to that employed in the embodiment 3 (see FIGS. 10, 13 and 14), its detailed circuit description will be omitted.

Figure 19:
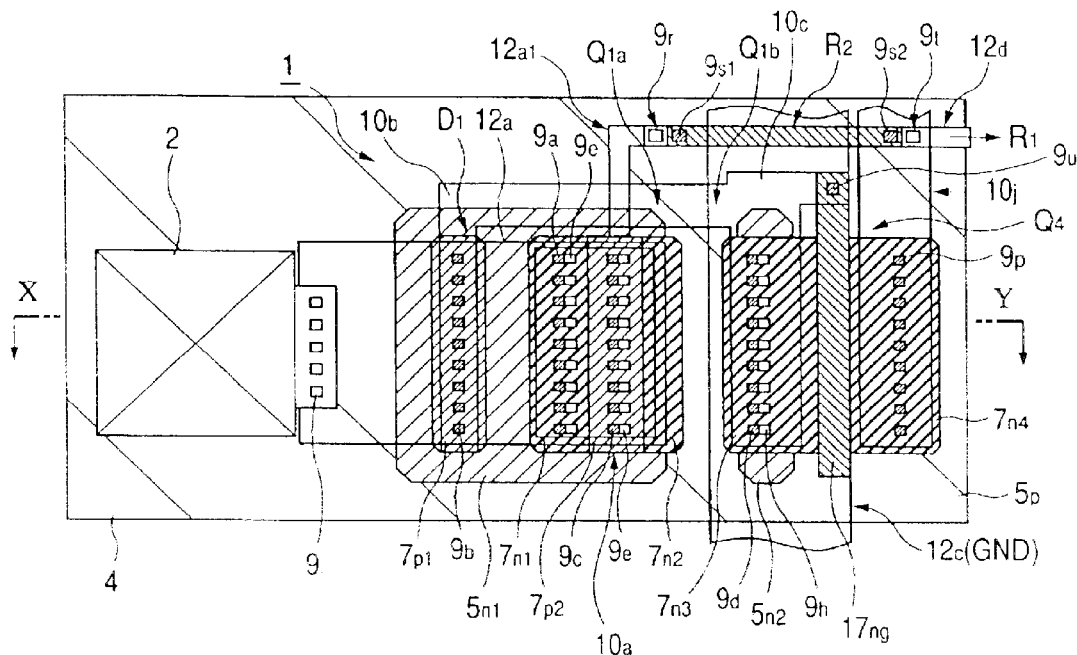
FIG. 19 is a plan view illustrating a protection circuit employed in the semiconductor integrated circuit device shown in FIG. 18.
Figure 20:
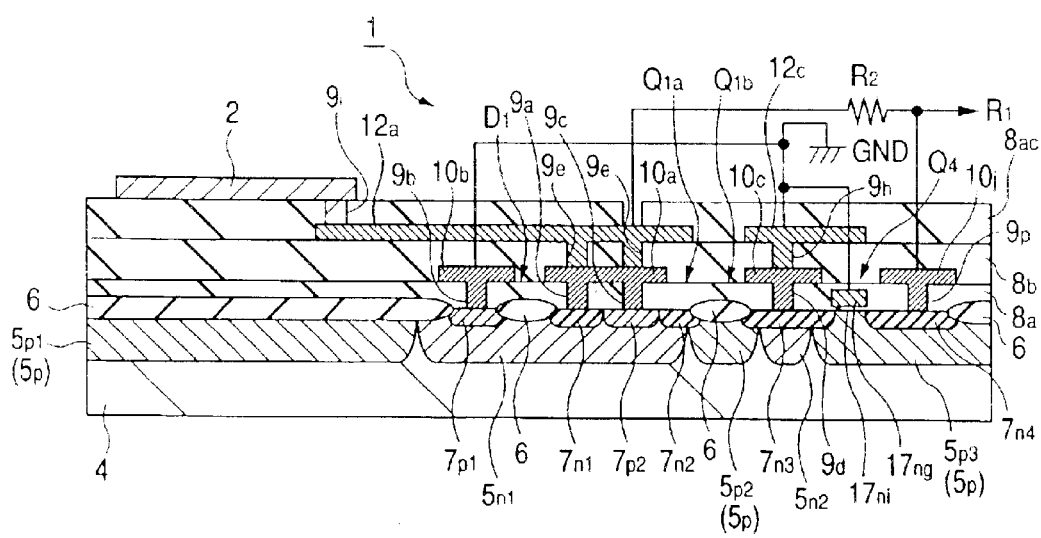
FIG. 20 is a cross-sectional view taken along line X-Y of FIG. 19.
Figure 22:
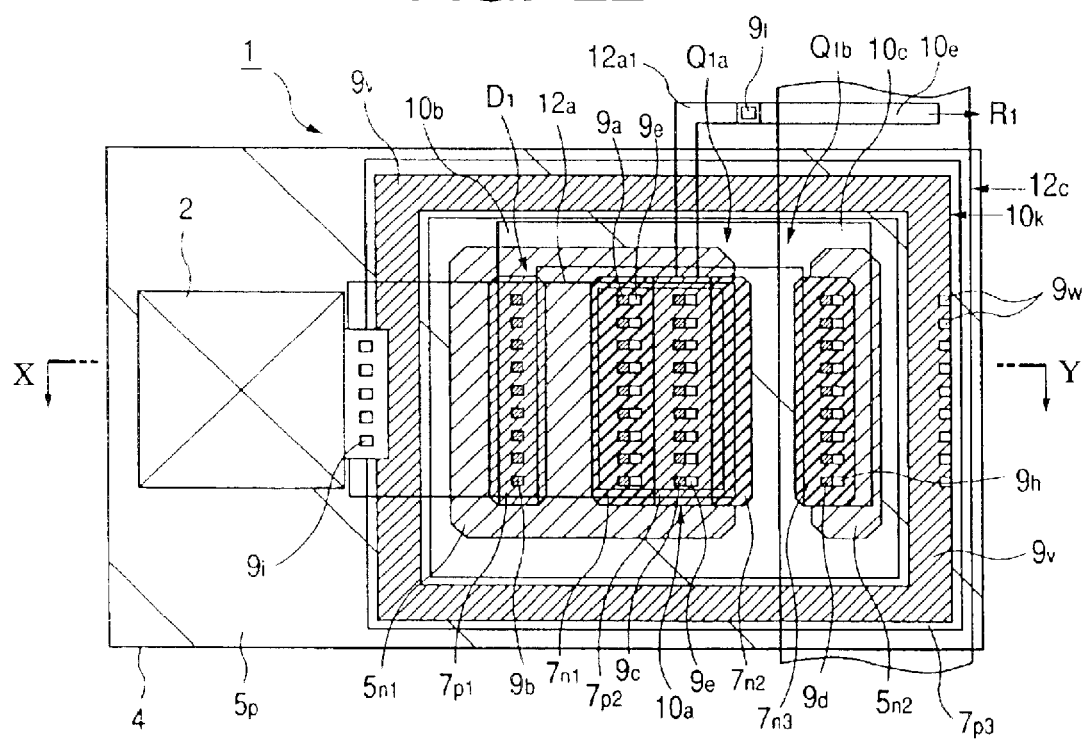
FIG. 22 is a plan view showing a protection circuit employed in the semiconductor integrated circuit device shown in FIG. 21.
Figure 23:
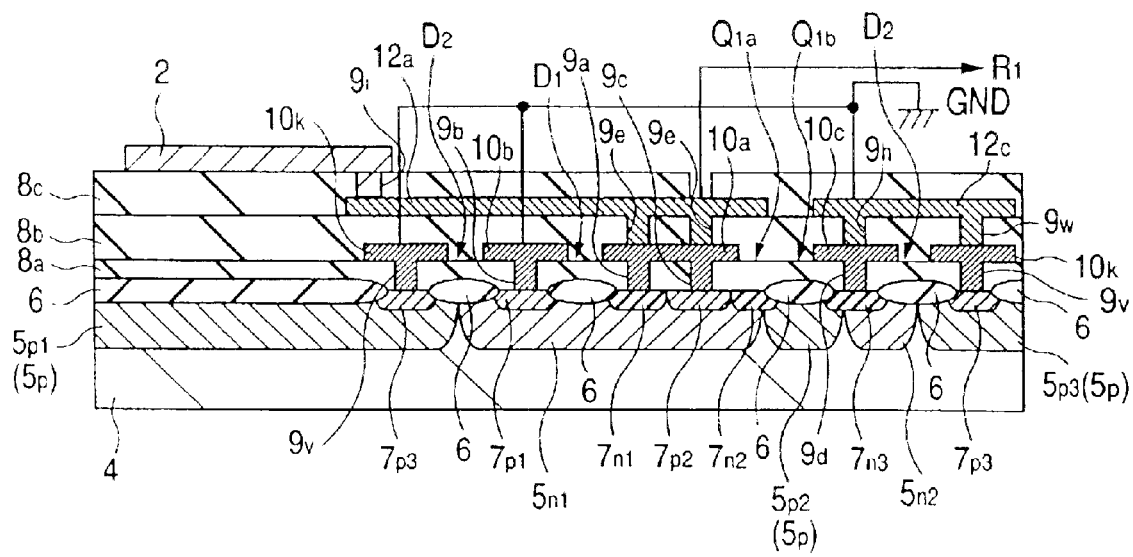
FIG. 23 is a cross-sectional view taken along line X-Y of FIG. 22.

A device, structure, is constructed by providing the p$^+$-type semiconductor region 7p3 at the upper portion of the p well 5p as shown in FIGS. 22 and 23 so as to surround the diode D1, bipolar transistors Q1a and Q1b and MOS.FET Q4 shown in FIGS. 19 and 20 on a plane basis. In this case, the second layer interconnection 12c shown in FIG. 19 is electrically connected to the n±-type semiconductor region 7n3 of the MOS.FET Q4. Further, the second layer interconnection 12c is electrically connected to the p$^+$-type semiconductor region 7p3 of the diode D2 as shown in FIGS. 22 and 23.

The advantageous effects obtained in the embodiments 1 through 5 can be obtained even in the case of the present embodiment 7.

[Embodiment 8]

Figure 28:
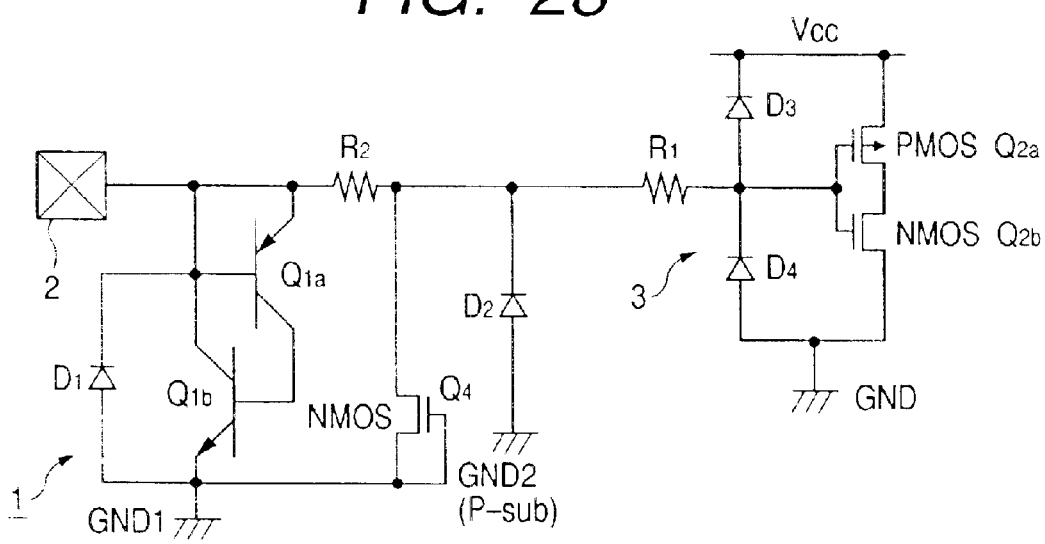
FIG. 28 is a circuit diagram depicting a semiconductor integrated circuit device according to a still further embodiment of the present invention.

A semiconductor integrated circuit device according to an embodiment 8 of the present invention will next be described with reference to FIG. 28. The protection circuit 1 employed in the present embodiment 8 is a combination of the embodiment 4 (see FIG. 18) and the embodiment 6 (see FIG. 24) and has a resistor R2, an n channel MOS.FET Q4 and a diode D2 in addition to the thyristor (bipolar transistors Q1a and Q1b) and the diode D1. That is, in the present embodiment 8, the resistors R1 and R2 are interposed between an external terminal 2 and the input of an inverter INV1 in a peripheral circuit 3. The n channel MOS.FET Q4 is electrically connected between an interconnection for making a connection between the resistors R1 and R2 and a ground source GND1 in a state in which a gate electrode thereof is being connected to the ground source GND1. Further, the diode D2 is electrically connected between the interconnection for connecting the resistors R1 and R2 to each other and a ground source GND2. The ground sources GND1 and GND2 are respectively separately used for the thyristor (bipolar transistors Q1a and Q1b) and the diode D1, and the diode D2 in the present embodiment 8. The ground sources GND1 and GND2 are electrically separated from each other. Although the invention is not so limited in particular, the ground source GND1 is set to, for example, about 0 (zero) V and the ground source GND2 is set to, for example, about −1.5V.

The present embodiment 8 is one in which consideration is given to the case where the present invention is applied to, for example, a product for setting the potential at a semiconductor substrate to a negative potential by an internal source. Since the diode D2 is placed within the p well 5p (see FIGS. 25 and 26) in this case, the diode D2 is electrically connection to the ground source GND2 set by the internal power source. Therefore, there may be cases in which the above-described overcurrent is not allowed to satisfactorily escape through the diode D2. However, since the diode D1 of the protection circuit 1 is provided within the n well 5n1 (see FIGS. 25 and 26) electrically, separated from the semiconductor substrate 4, the diode D1 can be electrically connected to the ground source GND1 set by an external power source. Thus, even if a negative overvoltage is applied to the external terminal 2, an excessive current or overcurrent produced by, its application can be promptly discharged to the ground source GND1 through the diode D1. Therefore, the ESD resistance can be enhanced even, in the case of a product for setting the potential at the semiconductor substrate to the negative potential by the internal power source.

The emitter region of the bipolar transistor Q1a constituting the thyristor and the p type semiconductor region of the diode D1 are disposed within the same well and the MOS.FET Q4 and the diode D2 are disposed in the neighborhood of the thyristor. Since a peripheral circuit 3 provided posterior to the protection circuit 1 is identical to that employed in the embodiment 3 (see FIGS. 10, 13 and 14), its detailed circuit description will be omitted.

The device structure employed in the present embodiment 8 is substantially identical to that employed in the embodiment 7. In the present embodiment 8, however, second layer interconnections 12c1 and 12c2 for the ground sources GND1 and GND2 are provided as shown in FIGS. 25 and 26. The second layer interconnection 12c1 is electrically connected to a first layer interconnection 10b through connecting holes 9h. Further, the second layer interconnection 12c1 is electrically connected to the diode D1 and the thyristor (bipolar transistors Q1a and Q1b) through the first layer interconnection 10b. The second layer interconnection 12c2 is electrically connected to a first layer interconnection 10k through connecting holes 9v. Further, the second layer interconnection 12c2 is electrically connected to the diode D2 through the first layer in reconnection 10k.

Even in the case of the present embodiment 8, the advantageous effects obtained in the embodiments 1 through 4 and 6 can be obtained.

Although the invention made by the present inventors has been described above specifically with reference to various embodiments, the present invention is not necessarily limited to the embodiments 1 through 3. It is needless to say that various changes can be made to the invention within a scope not departing from the gist or substance thereof.

The embodiments 1 through 3 represent, for example, the case in which the semiconductor substrate uses p-type Si. The invention is however not limited to this. The semiconductor substrate may be constructed as n-type Si, for example.

The embodiments 2 and 3 have been described for the case in which the p$^+$-type semiconductor regions are formed so as to surround one by one the protection elements of the individual thyristor structures respectively connected to the plurality of external terminals. However, the present invention is not necessarily limited to this. For example, the p$^+$-type semiconductor regions may be formed so as to collectively surround in plural form, the protection elements of the Individual thyristor structures respectively connected to the plurality of external terminals.

As has been described above, the semiconductor integrated circuit device of the present invention and the method of manufacturing the same are suitable for use in a memory circuit such as a DRAM (Dynamic Random Access Memory), an SPAM (Static Random Access Memory) or the like, a logic circuit such as a microprocessor or the like, a semiconductor integrated circuit device having a memory circuit and a logic circuit provided on the same semiconductor substrate, or an electronic circuit device having these features.

What is claimed is:

1. A semiconductor integrated circuit device comprising:
    a protection element having a thyristor structure, which is electrically connected between a first external terminal for receiving a signal and a second external terminal to be coupled to a fixed potential, said protection element being provided on a semiconductor substrate; and
    a diode serving as a protection element electrically connected between said first external terminal and said second external terminal so that said diode is connected in the forward direction when a negative overvoltage is applied to said first external terminal,
    wherein said thyristor structure includes:
    a first semiconductor region of a first conductivity type formed in the semiconductor substrate;
    a second semiconductor region of a second conductivity type opposite to that of said first semiconductor region, said second semiconductor region being formed in the semiconductor substrate so as to be adjacent to said first semiconductor region;
    a third semiconductor region of said second conductivity type formed within said first semiconductor region and electrically connected to said first external terminal, and
    a fourth semiconductor region of said first conductivity type formed within said second semiconductor region and electrically connected to said second external terminal,
    wherein said diode includes:
    a fifth semiconductor region of said first conductivity type formed within said first semiconductor region and electrically connected to said first external terminal; and
    a sixth semiconductor region of said second conductivity type formed within said first semiconductor region and electrically connected to said second external terminal,
    wherein the semiconductor integrated circuit device further includes a seventh semiconductor region of said first conductivity type formed within said first semiconductor region and extending into said second semiconductor region, said seventh semiconductor region having a higher impurity concentration than that of said first semiconductor region.

2. A semiconductor integrated circuit device according to claim 1, wherein said fifth semiconductor region and said sixth semiconductor region are disposed so that respective long sides thereof are opposed to each other in parallel.

3. A semiconductor integrated circuit device according to claim 1, wherein said third semiconductor region and said seventh semiconductor region are disposed so that respective long sides thereof are opposed to each other in parallel.

4. A semiconductor integrated circuit device comprising:

a protection element having a thyristor structure, which is electrically connected between an external terminal for receiving a signal and a ground potential, said protection element being provided on a semiconductor substrate; and a diode serving as a protection element electrically connected between said external terminal and said ground potential so that said diode is connected in the forward direction when a negative overvoltage is applied to said external terminal, wherein said thyristor structure includes:

a first semiconductor region of N conductivity type formed in the semiconductor substrate;

a second semiconductor region of P conductivity type, said second semiconductor region being formed in the semiconductor substrate so as to be adjacent to said first semiconductor region;

a third semiconductor region of said P conductivity type formed within said first semiconductor region and electrically connected to said external terminal; and a fourth semiconductor region of said N conductivity type formed within said second semiconductor region and electrically connected to said ground potential, wherein said diode includes:

a fifth semiconductor region of said N conductivity type formed within said first semiconductor region and electrically connected to said external terminal; and a sixth semiconductor region of said P conductivity type formed within said first semiconductor region and electrically connected to said ground potential, and wherein the semiconductor integrated circuit device further includes a seventh semiconductor region of said N conductivity type formed within said first semiconductor region and extending into said second semiconductor region, said seventh semiconductor region having a higher impurity concentration than that of said first semiconductor region.

5. A semiconductor integrated circuit device comprising:

a protection element having a thyristor structure, which is electrically connected between a first external terminal and a second external terminal, said protection element being provided on a semiconductor substrate; and a diode serving as a protection element electrically connected between said first external terminal and said second external terminal so that said diode is connected in the forward direction when a negative overvoltage is applied to said first external terminal, wherein said thyristor structure includes:

a first semiconductor region of a first conductivity type formed in the semiconductor substrate;

a second semiconductor region of a second conductivity type opposite to that of said first semiconductor region, said second semiconductor region being formed in the semiconductor substrate so as to be adjacent to said first semiconductor region;

a third semiconductor region of said second conductivity type formed within said first semiconductor region and electrically connected to said first external terminal, and a fourth semiconductor region of said first conductivity type formed within said second semiconductor region and electrically connected to said second external terminal, and wherein said diode includes:

a fifth semiconductor region of said first conductivity type, formed within said first semiconductor region and electrically connected to said first external terminal; and a sixth semiconductor region of said second conductivity type formed within said first semiconductor region and electrically connected to said second external terminal, and wherein said semiconductor integrated circuit device further comprises a seventh semiconductor region of said first conductivity type formed within said first semiconductor region and extending into said second semiconductor region, said seventh semiconductor region having a higher impurity concentration than that of said first semiconductor region.

6. A semiconductor integrated circuit device according to claim 5, wherein said third semiconductor region and said seventh semiconductor region a re disposed so that respective long sides there of are opposed to each other in parallel.

7. A semiconductor integrated circuit device comprising:

a first protection element having a thyristor structure and formed in a semiconductor substrate; and a second protection element having a diode structure and formed in said semiconductor substrate, wherein said first protection element includes a first region of a first conductivity type, a second region of a second conductivity type opposite to said first conductivity type, a third region of said first conductivity type and a fourth region of said second conductivity type, wherein said first region is formed in said second region and is electrically connected to an external terminal for receiving a signal, wherein said second region is electrically connected to said external terminal, wherein said third region is formed between said second region and said fourth region, wherein said fourth region is electrically connected to a reference potential, wherein said second protection element includes a fifth region having said first conductivity type and is formed in said second region such that said fifth region is electrically connected to a reference potential and such that a PN junction is formed between said fifth region and said second region, and wherein said first protection element includes an additional region having said second conductivity type, having an impurity concentration higher than that of said fourth region and formed both in said fourth region and in said third region.

8. A semiconductor integrated circuit device according to claim 7, wherein said first protection element includes a further region having said second conductivity type, having an impurity concentration higher than that of said second region and formed both in said second region and in said third region.

9. A semiconductor integrated circuit device comprising:

a first protection element having a thyristor structure and formed in a semiconductor substrate;

a second protection element having a diode structure and formed in said semiconductor substrate; and a third protection element having a diode structure and a semiconductor region formed in said semiconductor substrate such that said third protection element and said second protection element are separate from each other, wherein said first protection element includes a first region of a first conductivity type, a second region of a second conductivity type opposite to said first conductivity type, a third semiconductor region of said first conductivity type and a fourth semiconductor region of said second conductivity type, wherein said first region is formed in said second region and electrically connected to an external terminal for signal, wherein said second region electrically is connected to said external terminal, wherein said third region is formed between said second region and said fourth region, wherein said fourth region electrically connected to a reference potential, and wherein said second protection element is coupled between said external terminal and said reference potential, wherein said fourth region serves as said semiconductor region of said third protective element, and wherein said first protection element includes an additional region having said second conductivity type, having an impurity concentration higher than that of said fourth region and formed both in said fourth region and in said third region.

10. A semiconductor integrated circuit device according to claim 9, wherein said first protection element includes a sixth region having said second conductivity type, having an impurity concentration higher than that of said second region and formed both in said second region and in said third region.

11. A semiconductor integrated circuit device according to claim 9, wherein said second protection element includes a fifth region having said first conductivity type and formed in said second region such that said fifth region is electrically connected to a reference potential and such that a PN junction is formed between said fifth region and said second region.

12. A semiconductor integrated circuit device comprising:

a protection element having a thyristor structure, which is electrically connected between a first external terminal for receiving a signal and a second external terminal to be coupled to a fixed potential, said protection element being provided on a semiconductor substrate; and a diode serving as a protection element electrically connected between said first external terminal and said second external terminal so that said diode is connected in the forward direction when a negative overvoltage is applied to said first external terminal, wherein said thyristor structure includes:

a first semiconductor region of a first conductivity type formed in the semiconductor substrate;

a second semiconductor region of a second conductivity type opposite to that of said first semiconductor region, said second semiconductor region being formed in the semiconductor substrate so as to be adjacent to said first semiconductor region;

a third semiconductor region of said second conductivity type formed within said first semiconductor region and electrically connected to said first external terminal; and a fourth semiconductor region of said first conductivity type formed within said second semiconductor region and electrically connected to said second external terminal, wherein said diode includes:

a fifth semiconductor region of said first conductivity type electrically connected to said first external terminal;

a sixth semiconductor region of said second conductivity type electrically connected to said second external terminal; and means for reducing resistance between said fifth and sixth semiconductor region for improving discharge of said negative overvoltage, and wherein said first protection element includes a seventh region having said second conductivity type, having an impurity concentration higher than that of said fourth region and formed both in said fourth region and in said third region.

13. A semiconductor integrated circuit device according to claim 12, wherein said reducing resistance means comprises said fifth and sixth semiconductor regions being formed to be adjacent one another within said first semiconductor region.

14. A semiconductor integrated circuit device according to claim 13, wherein said resistance reducing means further includes said fifth semiconductor region and said sixth semiconductor region being disposed within said first semiconductor region so that respective long sides thereof are opposed to each other in parallel.

* * * * *